United States Patent
Lin et al.

(10) Patent No.: US 11,901,235 B2
(45) Date of Patent: Feb. 13, 2024

(54) ION IMPLANTATION FOR NANO-FET

(71) Applicant: Taiwan Semiconductor Manufacturing Co., Ltd., Hsinchu (TW)

(72) Inventors: Yu-Chang Lin, Hsinchu (TW); Chun-Feng Nieh, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/824,610

(22) Filed: May 25, 2022

(65) Prior Publication Data
US 2022/0319930 A1 Oct. 6, 2022

Related U.S. Application Data

(63) Continuation of application No. 17/119,102, filed on Dec. 11, 2020, now Pat. No. 11,348,835.
(Continued)

(51) Int. Cl.
*H01L 21/8234* (2006.01)
*H01L 29/06* (2006.01)
(Continued)

(52) U.S. Cl.
CPC ........... *H01L 21/823412* (2013.01); *H01L 21/823431* (2013.01); *H01L 21/823807* (2013.01);
(Continued)

(58) Field of Classification Search
CPC ..... H01L 21/823412; H01L 21/823431; H01L 21/823807; H01L 21/823821; H01L 29/0669; H01L 29/068; H01L 29/42392; H01L 29/66545; H01L 29/775; H01L 29/785; H01L 29/78696; H01L 29/66553; H01L 21/26586; H01L 21/823814; H01L 21/823828; H01L 21/823857; H01L 21/823864; H01L 27/092; H01L 27/0924; H01L 29/0673; H01L 29/0847; H01L 29/66439; H01L 29/7848; B82Y 10/00; B82Y 40/00
See application file for complete search history.

(56) References Cited

U.S. PATENT DOCUMENTS

2004/0009643 A1 1/2004 Blanchard
2017/0256609 A1* 9/2017 Bhuwalka .......... H01L 29/78696
(Continued)

FOREIGN PATENT DOCUMENTS

| KR | 20170102701 A | 9/2017 |
| KR | 20170107364 A | 9/2017 |
| TW | 202020992 A | 6/2020 |

*Primary Examiner* — Cheung Lee
(74) *Attorney, Agent, or Firm* — Slater Matsil, LLP

(57) ABSTRACT

A nanoFET transistor includes doped channel junctions at either end of a channel region for one or more nanosheets of the nanoFET transistor. The channel junctions are formed by a iterative recessing and implanting process which is performed as recesses are made for the source/drain regions. The implanted doped channel junctions can be controlled to achieve a desired lateral straggling of the doped channel junctions.

20 Claims, 42 Drawing Sheets

Related U.S. Application Data

(60) Provisional application No. 63/059,218, filed on Jul. 31, 2020.

(51) Int. Cl.
| | |
|---|---|
| *H01L 29/66* | (2006.01) |
| *H01L 29/775* | (2006.01) |
| *H01L 29/78* | (2006.01) |
| *H01L 29/786* | (2006.01) |
| *H01L 21/8238* | (2006.01) |
| *H01L 29/423* | (2006.01) |

(52) U.S. Cl.
CPC .. *H01L 21/823821* (2013.01); *H01L 29/0669* (2013.01); *H01L 29/42392* (2013.01); *H01L 29/66545* (2013.01); *H01L 29/66553* (2013.01); *H01L 29/775* (2013.01); *H01L 29/785* (2013.01); *H01L 29/78696* (2013.01)

(56) References Cited

U.S. PATENT DOCUMENTS

| | | |
|---|---|---|
| 2017/0271477 A1 | 9/2017 | Palle et al. |
| 2018/0114834 A1 | 4/2018 | Cheng et al. |
| 2018/0151378 A1 | 5/2018 | Huang et al. |
| 2018/0240871 A1 | 8/2018 | Cheng et al. |
| 2018/0301531 A1* | 10/2018 | Xie .................. H01L 21/02532 |
| 2019/0189769 A1 | 6/2019 | Basker et al. |
| 2019/0341467 A1 | 11/2019 | Basker et al. |
| 2020/0161574 A1 | 5/2020 | Vaswn et al. |

* cited by examiner

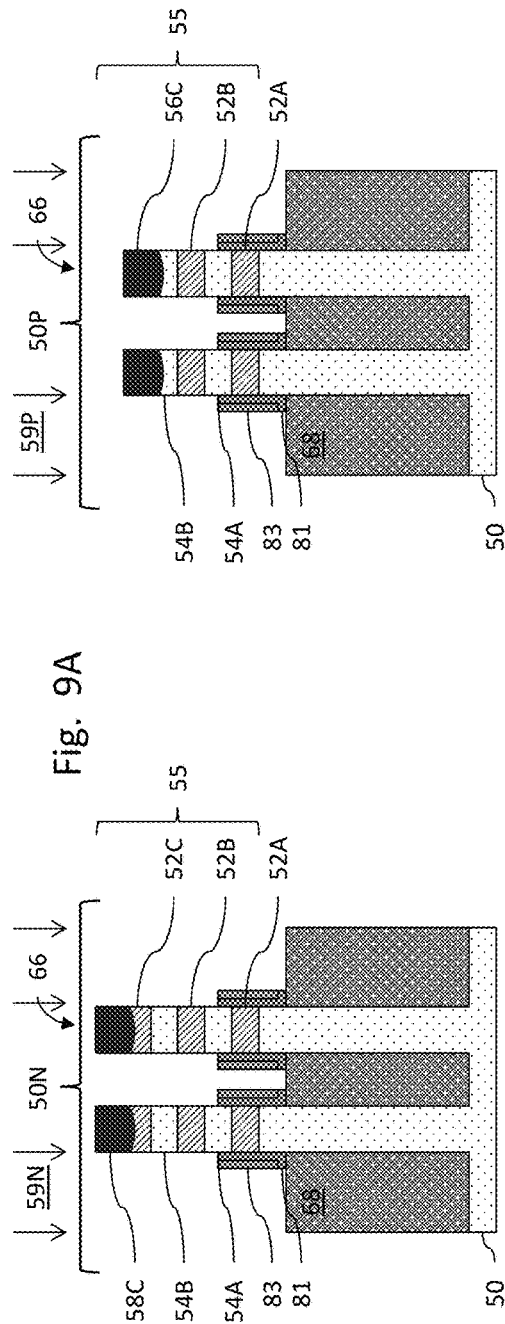
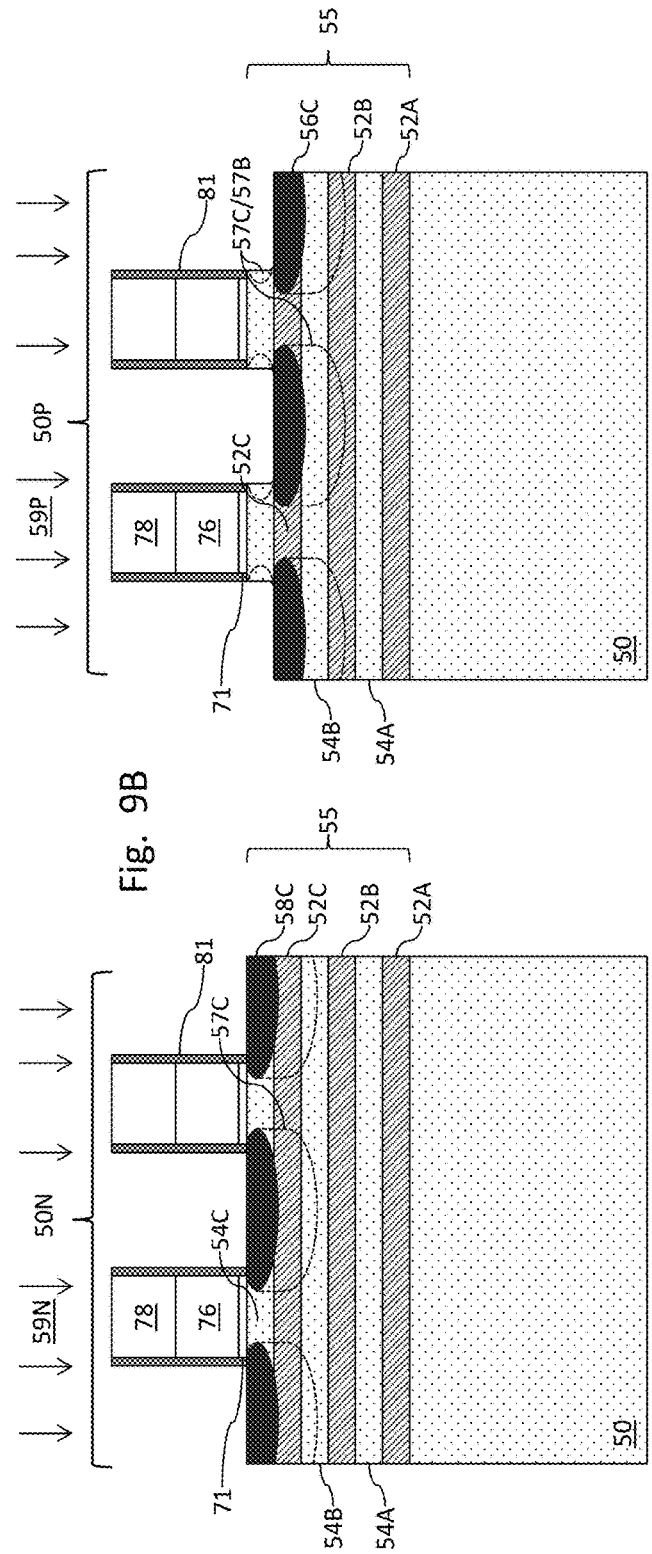
Fig. 9A
Fig. 9B

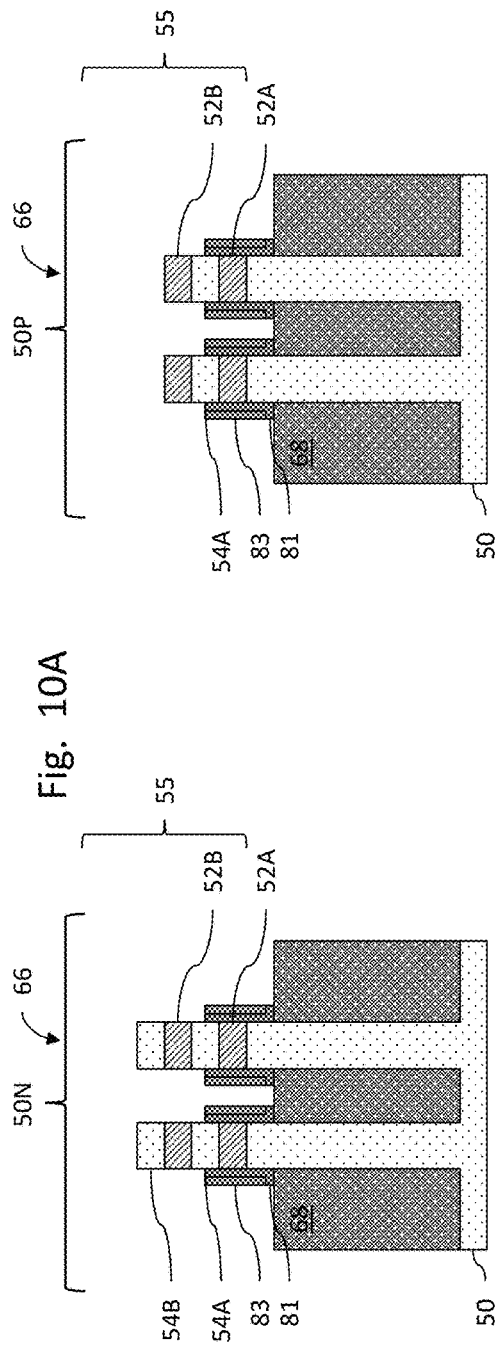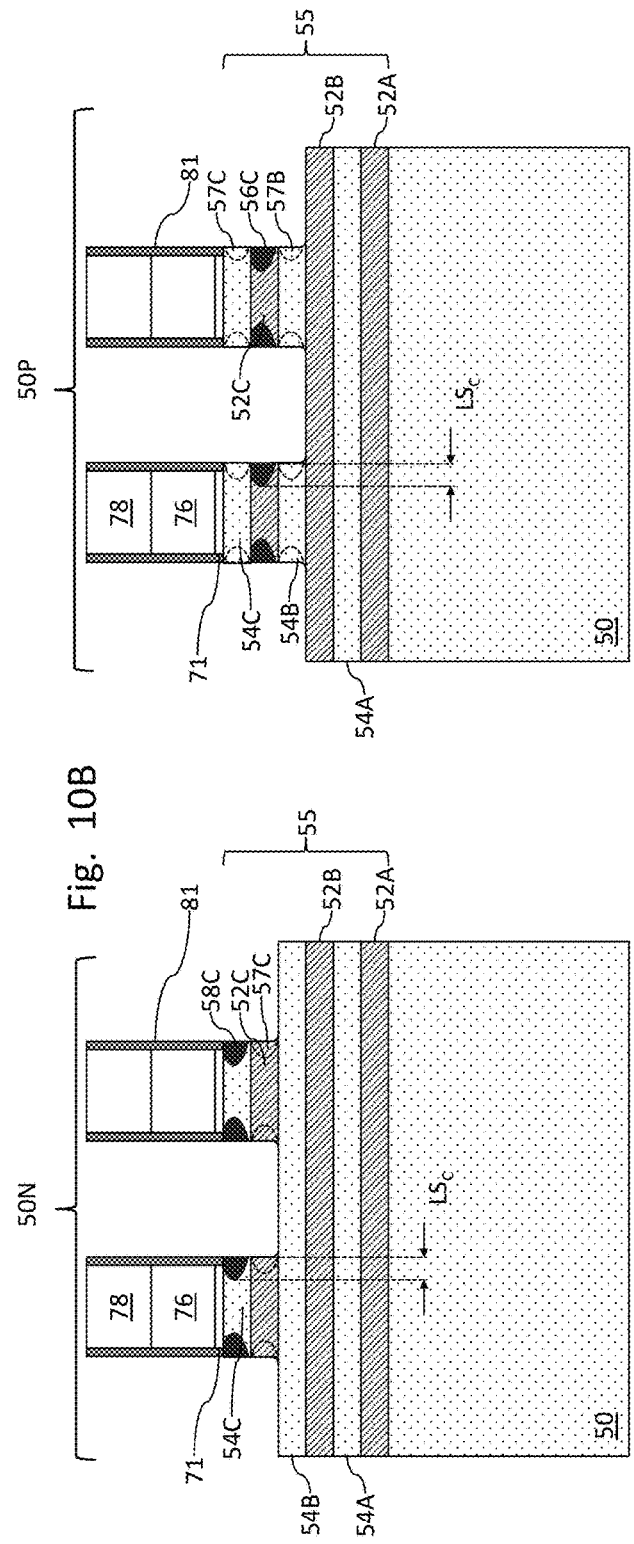
Fig. 10A
Fig. 10B

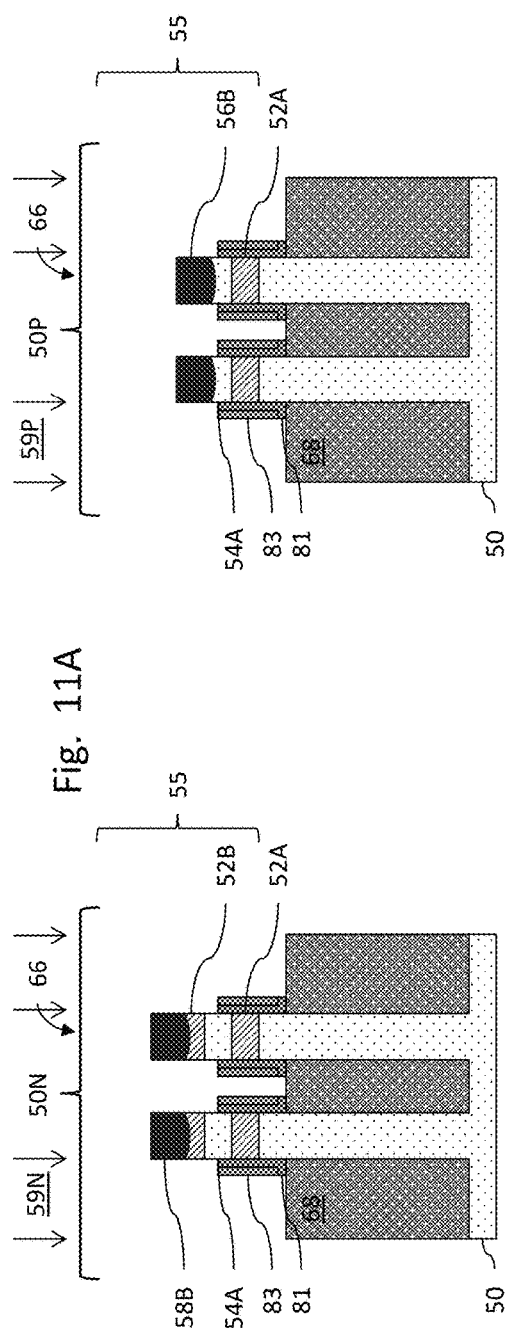
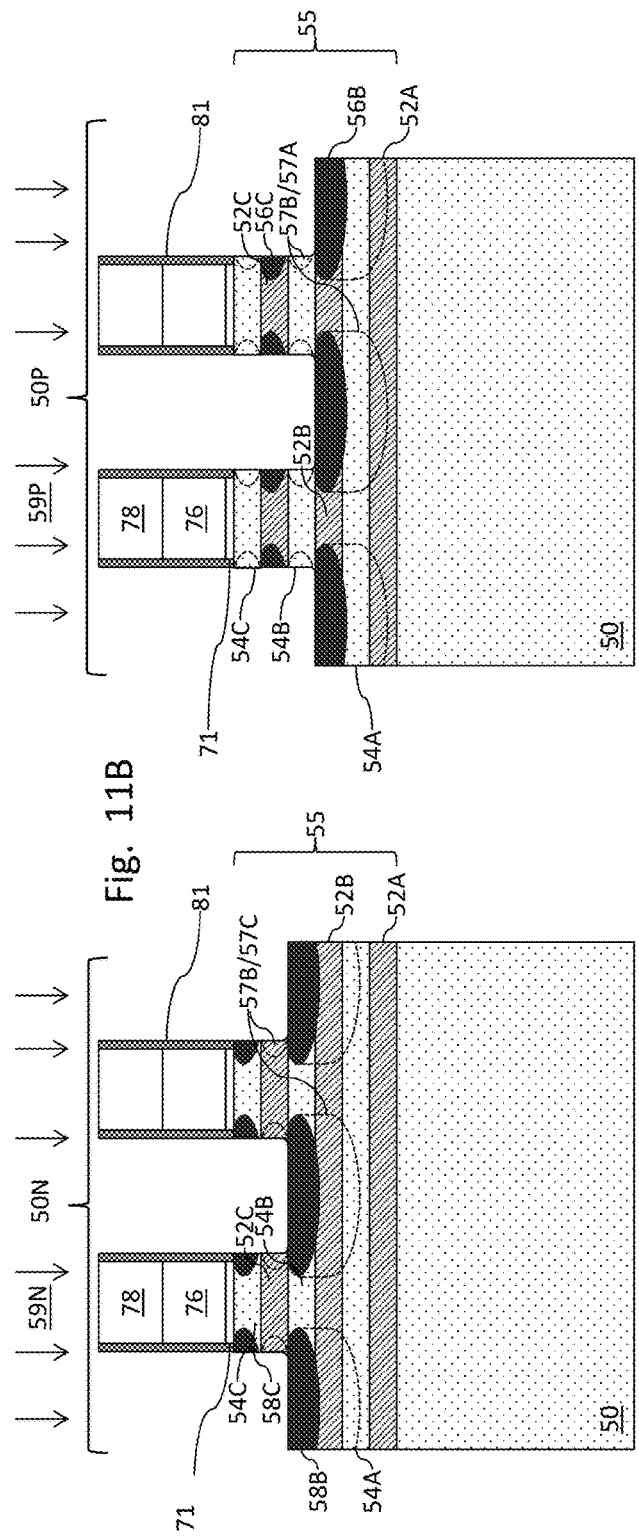
Fig. 11A
Fig. 11B

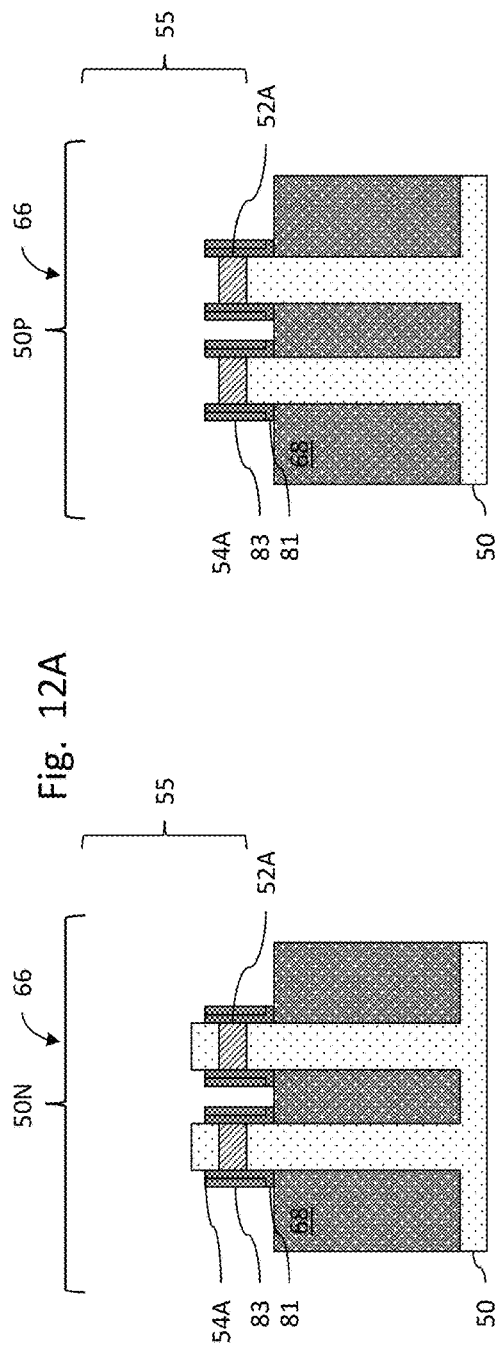
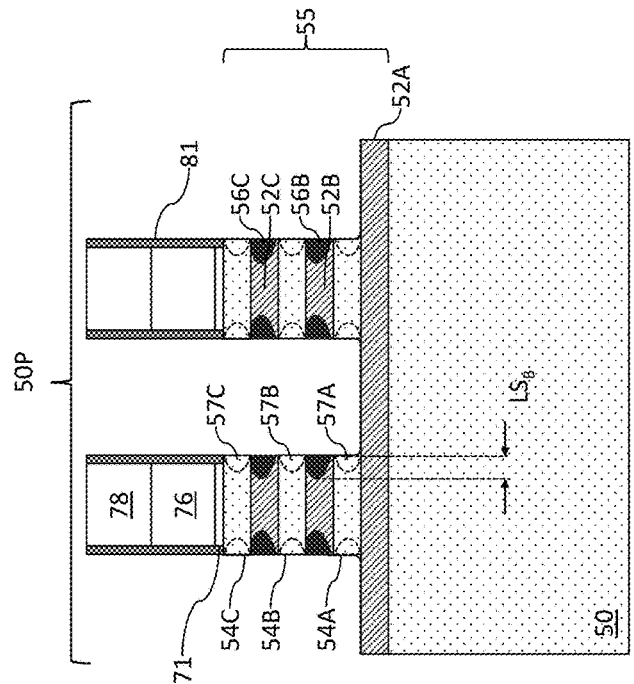
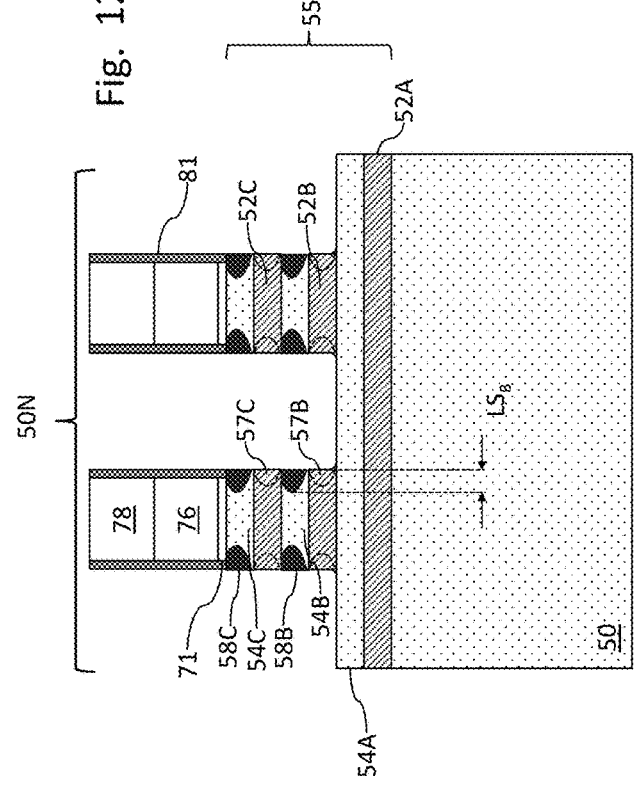
Fig. 12A
Fig. 12B

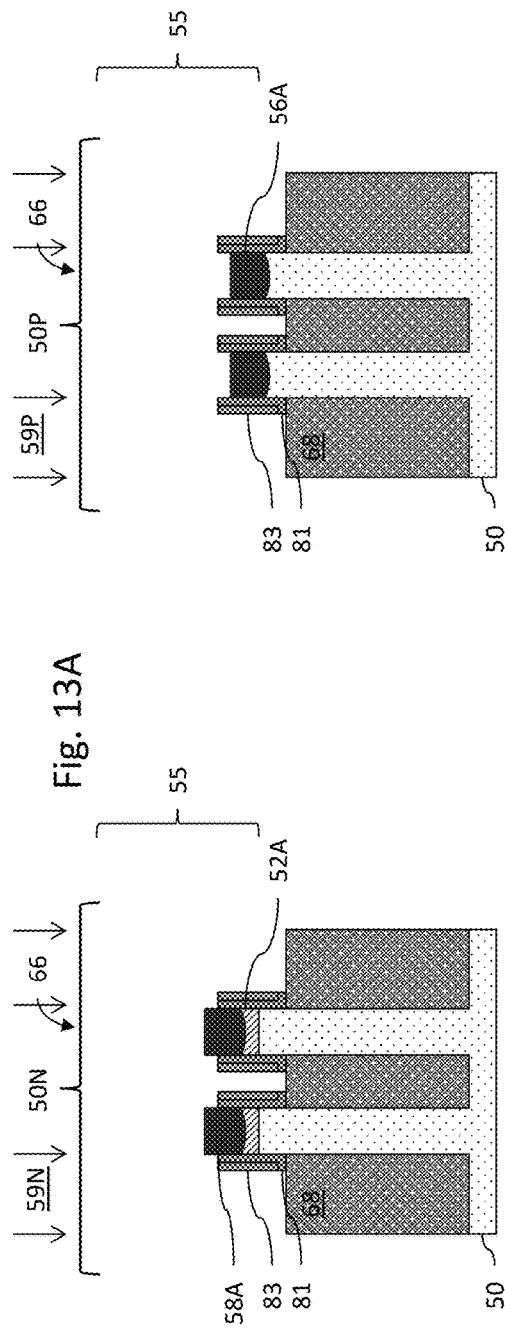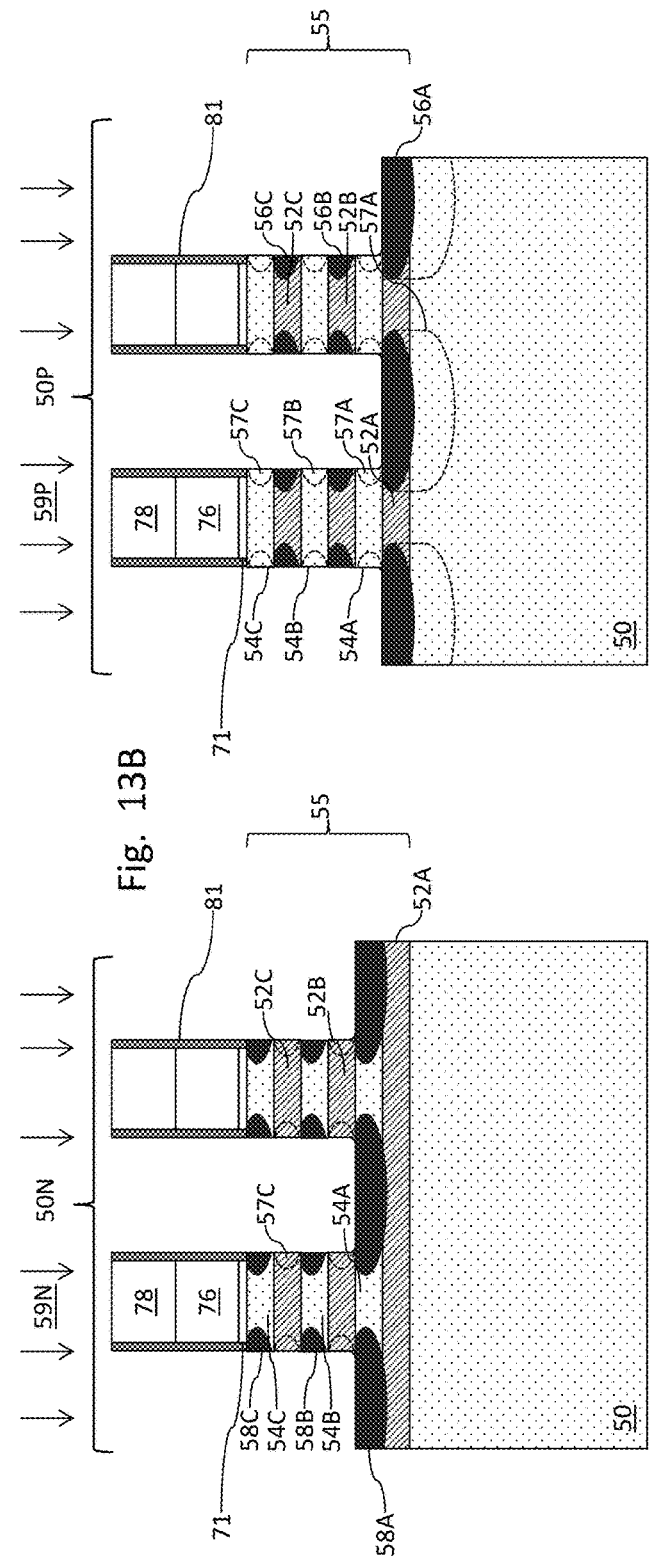
Fig. 13A
Fig. 13B

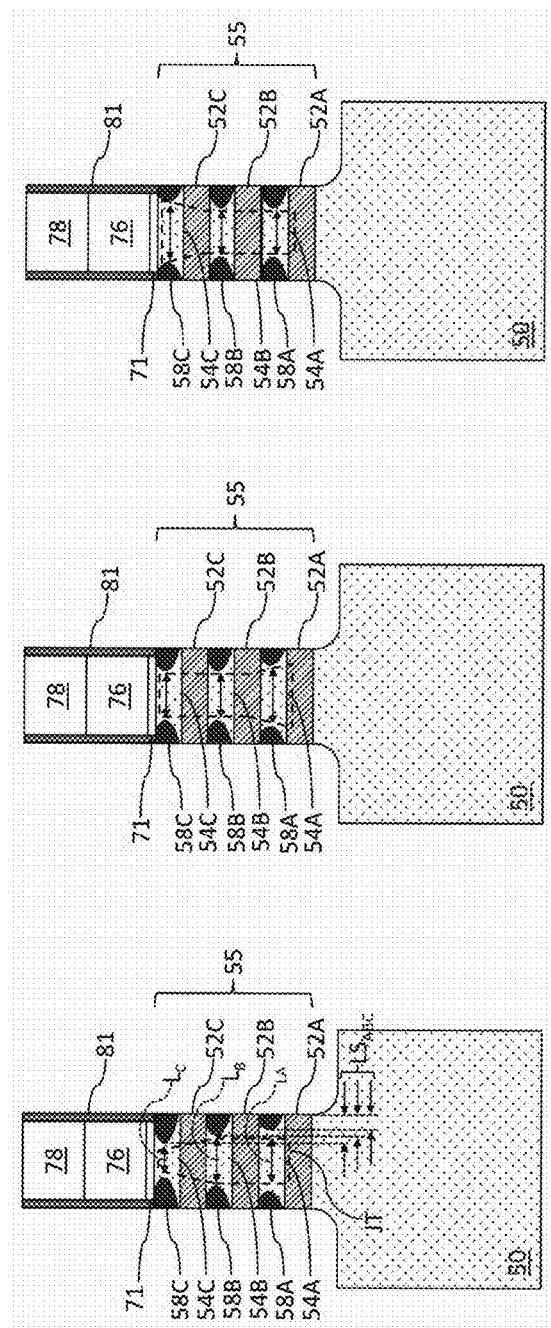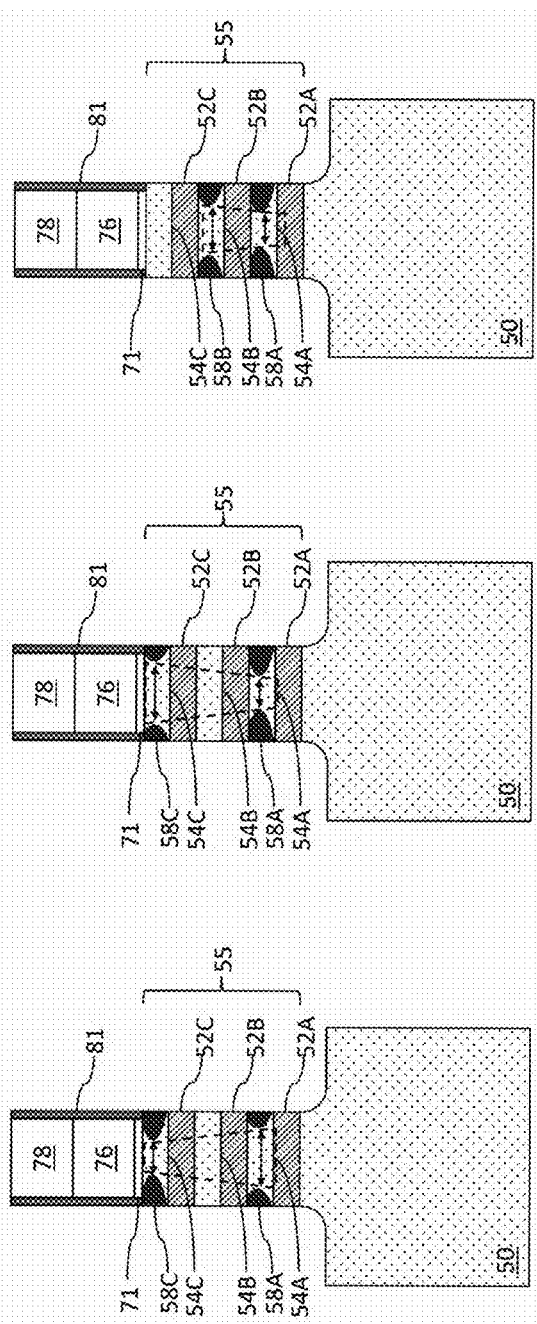

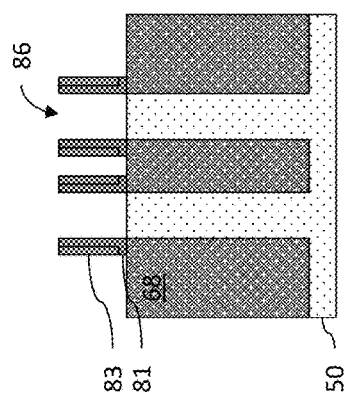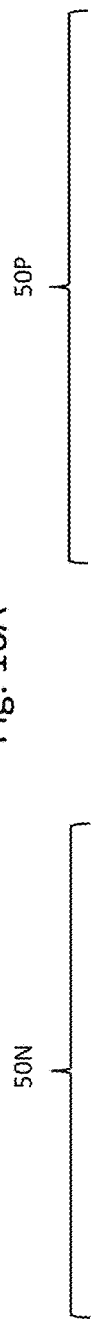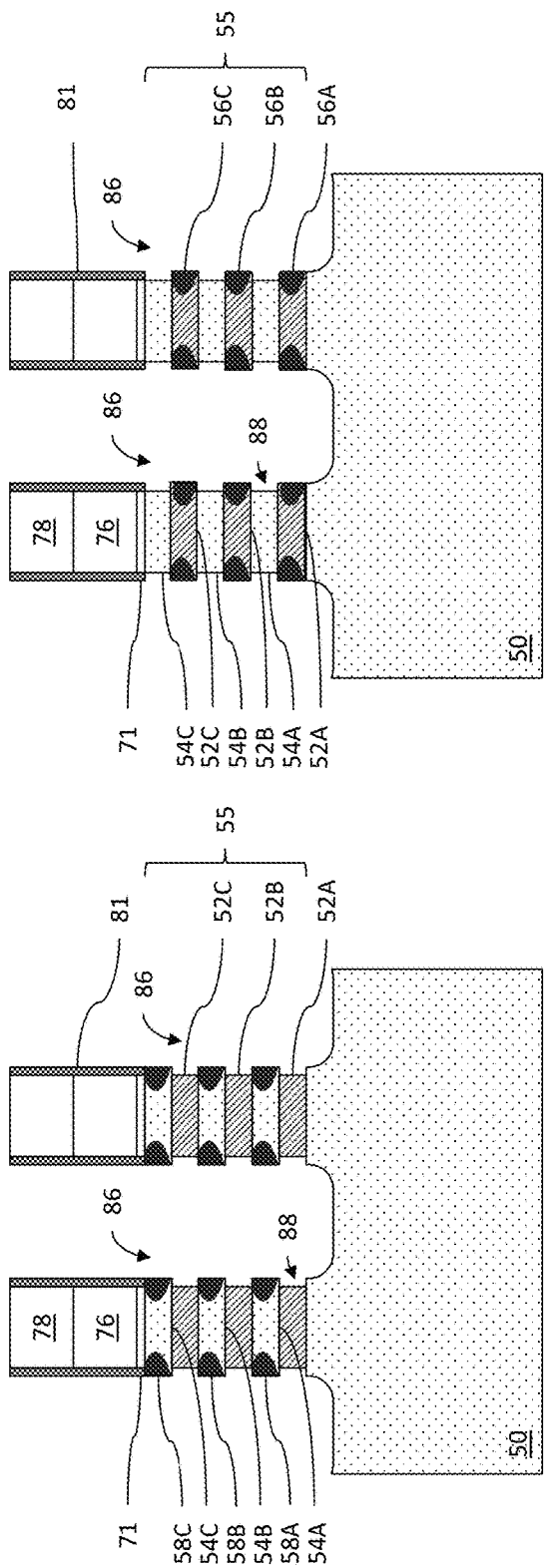
Fig. 16A
Fig. 16B

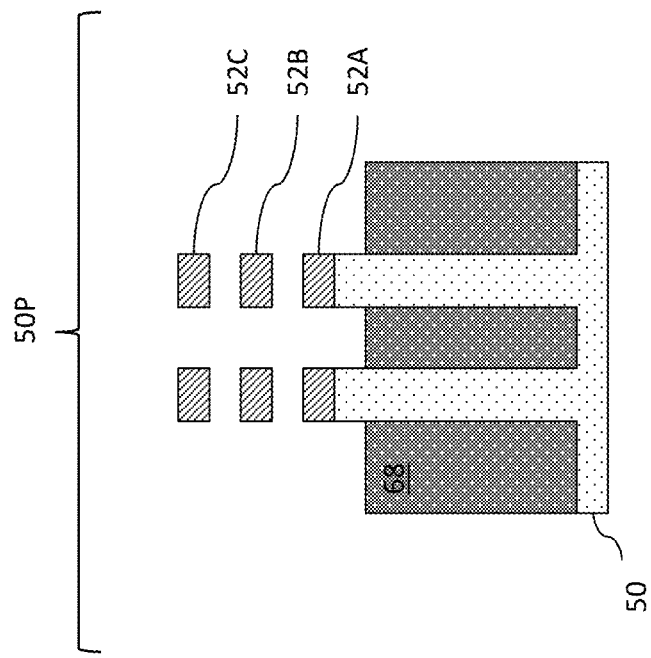
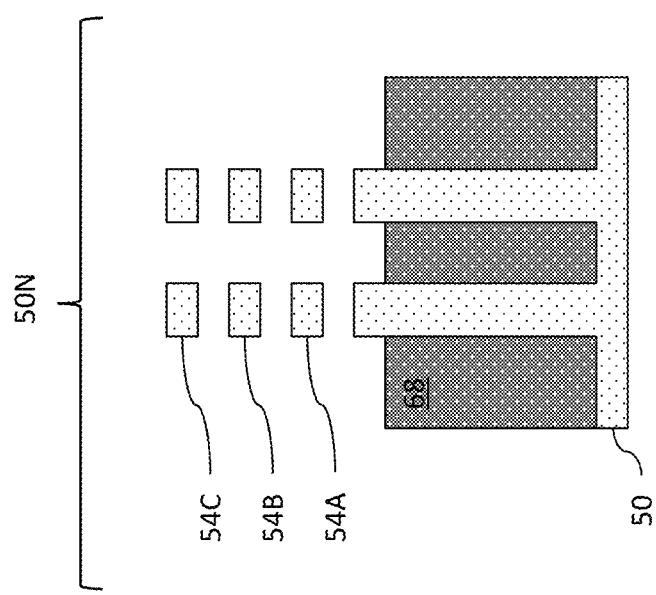
Fig. 22A

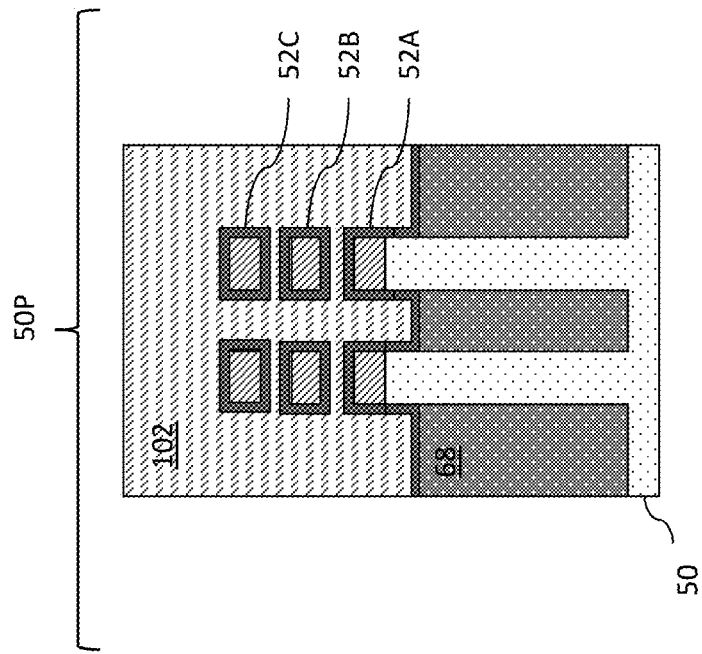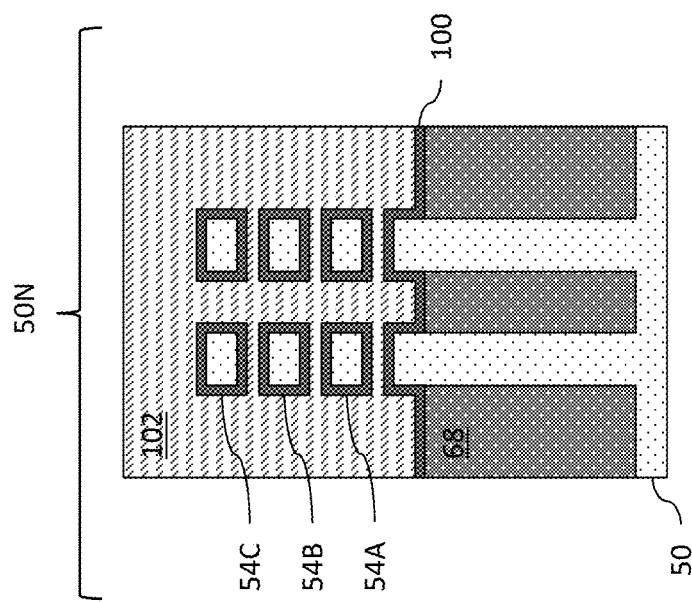
Fig. 23A

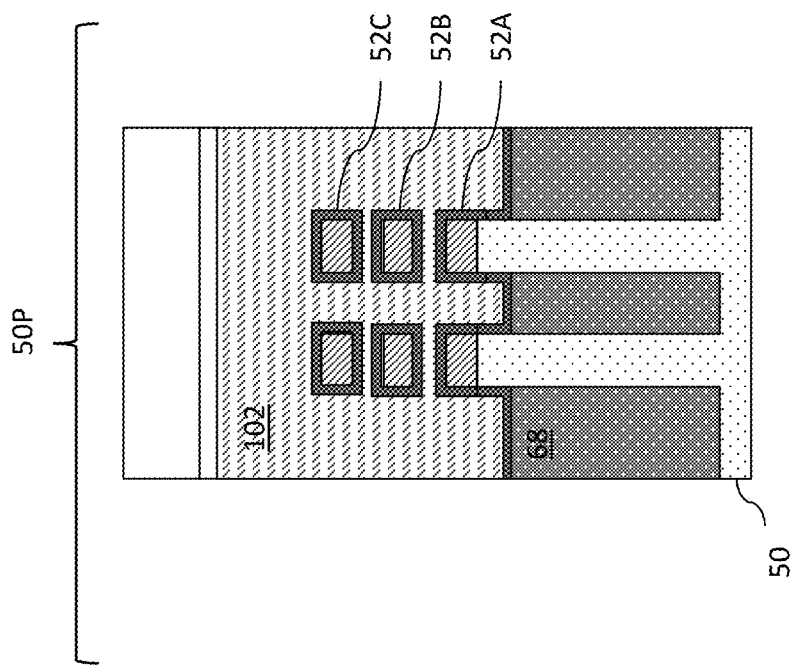
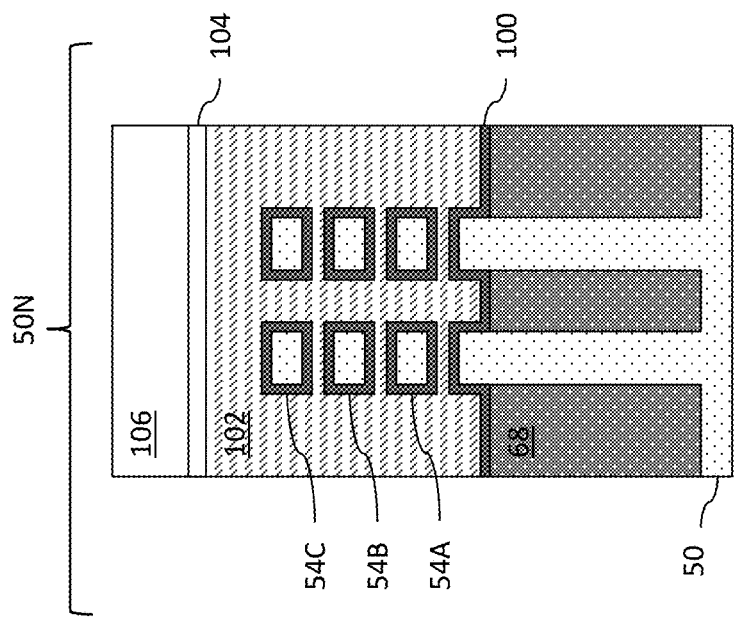
Fig. 24A

ION IMPLANTATION FOR NANO-FET

PRIORITY CLAIM AND CROSS-REFERENCE

This application is a continuation of U.S. application Ser. No. 17/119,102, filed on Dec. 11, 2020, which claims priority to U.S. Provisional Application No. 63/059,218, filed on Jul. 31, 2020, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11A, 11B, 12A, 12B, 13A, 13B, 14A, 14B, 16A, 16B, 17A, 17B, 17C, 18A, 18B, 18C, 18D, 19A, 19B, 19C, 20A, 20B, 21A, 21B, 22A, 22B, 23A, 23B, 24A, 24B, 24C, 25A, 25B, 25C, 26A, 26B and 26C are cross-sectional views of intermediate stages in the manufacturing of nano-FETs, in accordance with some embodiments.

FIGS. 15A, 15B, 15C, 15D, 15E, 15F, 15G, 15H, 15I, 15J, 15K, 15L, 15M, 15N, 15O, 15P, 15Q, 15R, 15S, 15T, and 15U illustrate various arrangements of implantation regions, in accordance with various embodiments.

DETAILED DESCRIPTION

Figure 1:
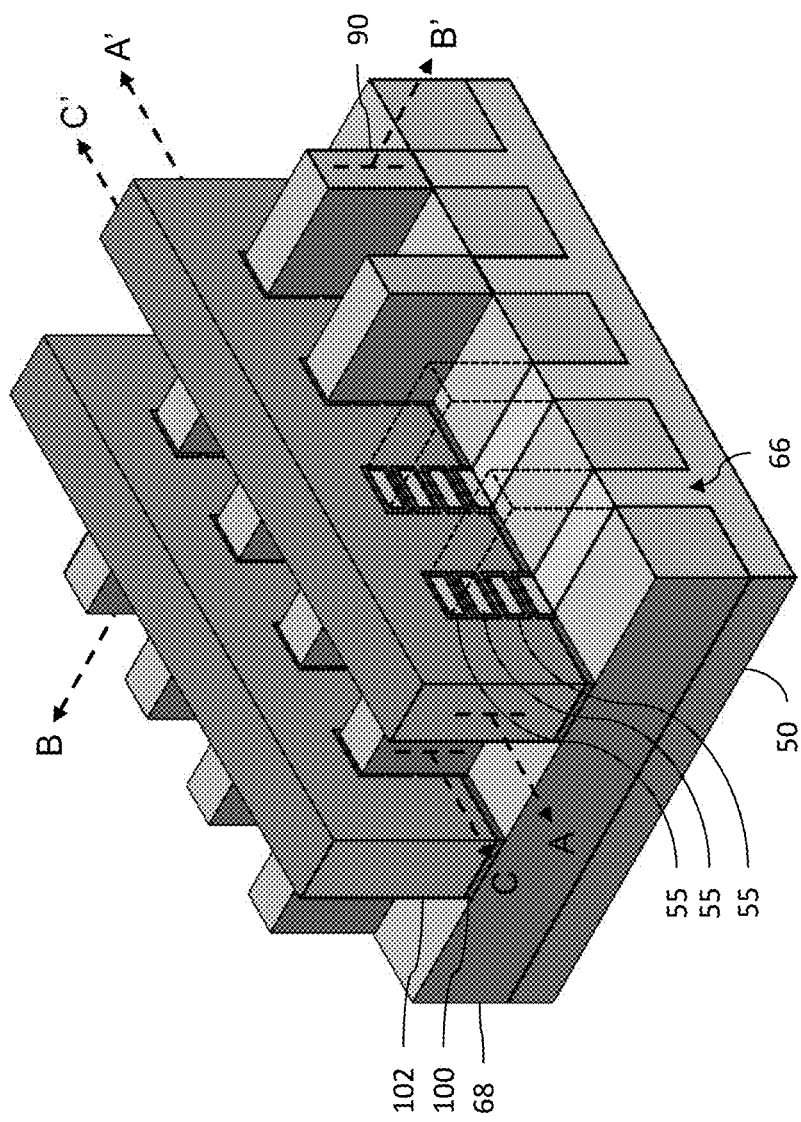
FIG. 1 illustrates an example of a nanostructure field-effect transistor (nano-FET or nanosheet FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments advantageously provide a process by which the channel regions of a nano-FET can be reliably doped by implantation ions. The doping process provides lateral channel junctions on either end of the stacked channel regions, thereby reducing channel resistance. Embodiment processes can customize the channel junction widths for each nanostructure of a nano-FET. When recesses are made for subsequent formation of the source/drain regions, multiple recess and angled implantation processes are used to selectively implant dopant ions in the ends of the nanosheet channels under the transistor gate. Using multiple recess and implantation processes provides the ability to control the lateral implantation depth, or lateral straggling, of the channel junctions.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano- FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in fin field-effect transistors (FinFETs).

FIGS. 2 through 26C are cross-sectional views of intermediate stages in the manufacturing of nano-FETs, in accordance with some embodiments. FIGS. 2 through 5, 6A, 19A, 20A, 21A, 22A, 23A, 24A, 25A, and 26A, illustrate reference cross-section A-A' illustrated in FIG. 1. FIGS. 6B, 7B, 8B, 9B, 10B, 11B, 12B, 13B, 14B, 15A, 15B, 15C, 15D, 15E, 15F, 15G, 15H, 15I, 15J, 15K, 15L, 15M, 15N, 15O, 15P, 15Q, 15R, 15S, 15T, 15U, 16B, 17B, 17C, 18B, 18D, 19B, 20B, 21B, 22B, 23B, 24B, 25B, and 26B illustrate reference cross-section B-B' illustrated in FIG. 1. FIGS. 7A, 8A, 9A, 10A, 11A, 12A, 13A, 14A, 16A, 17A, 18A, 18C, 19C, 24C, 25C, and 26C illustrate reference cross-section C-C' illustrated in FIG. 1.

Figure 2:
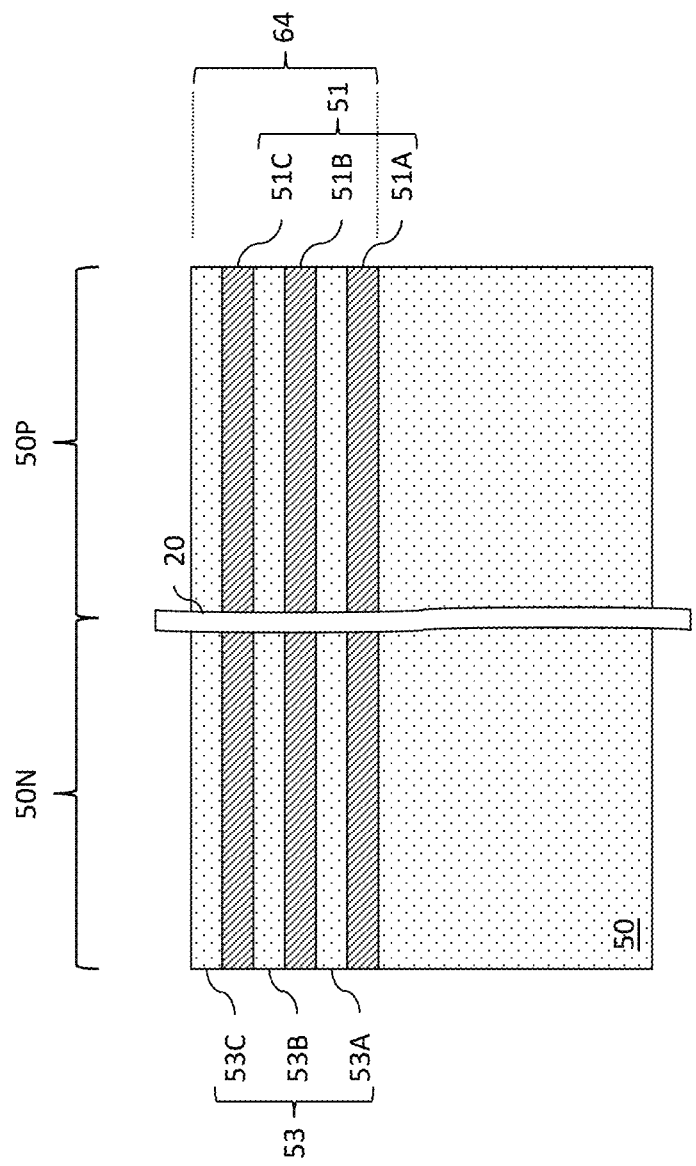

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P. In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, pure germanium, or the like, and the second semiconductor layers 53 may be formed of a second semiconductor material suitable for n-type nano-FETs, such as silicon, silicon carbon, silicon phosphorus, or the like. In some embodiments, the same materials may be used in both the n-type nanoFETs and p-type nanoFETs. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
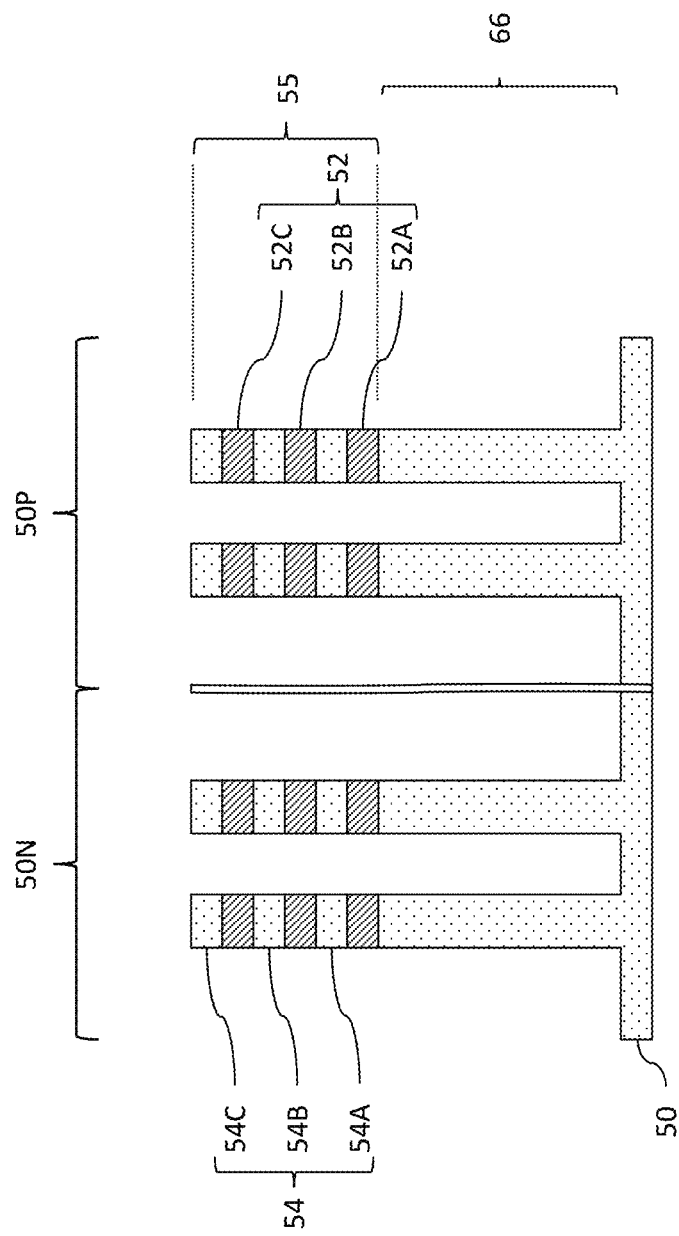

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
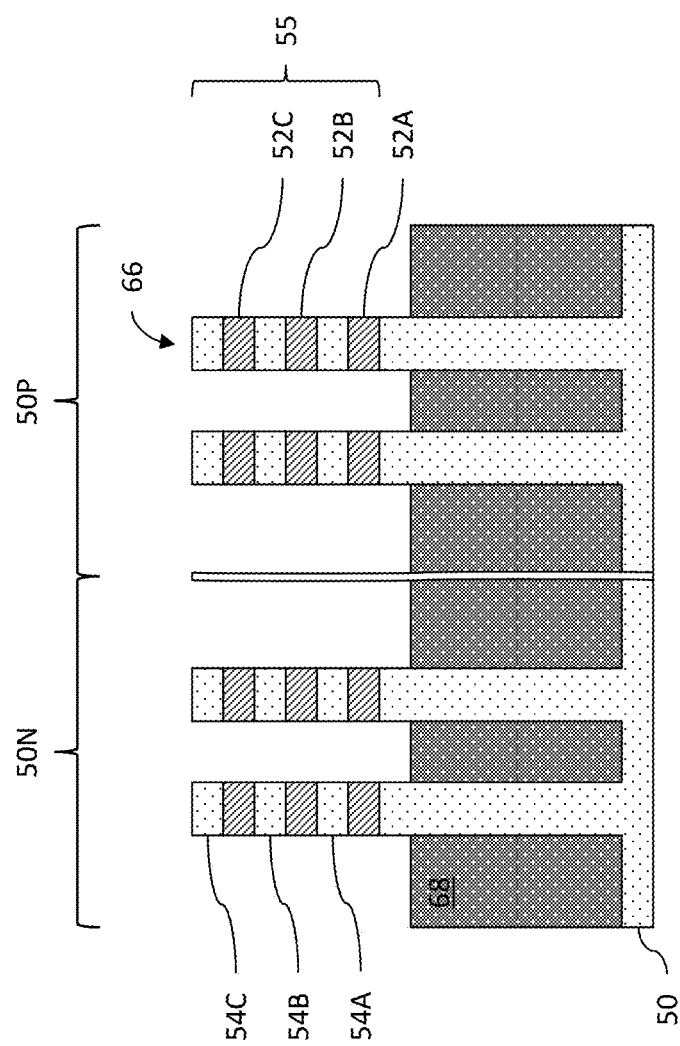

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

These implants may include implanting impurities into regions of the nanostructures 55 which will subsequently become channel regions for the p-type nano-FETs and the n-type nano-FETs. It is noted, however, that these implants may be predominantly uniform throughout the nanostructures 55 and likewise the subsequently formed channel regions. In contrast, embodiments described herein provide a way to form junctions in the channel regions to increase dopant concentration in the junctions and further reduce the channel resistance. This will be described in greater detail below.

Figure 5:
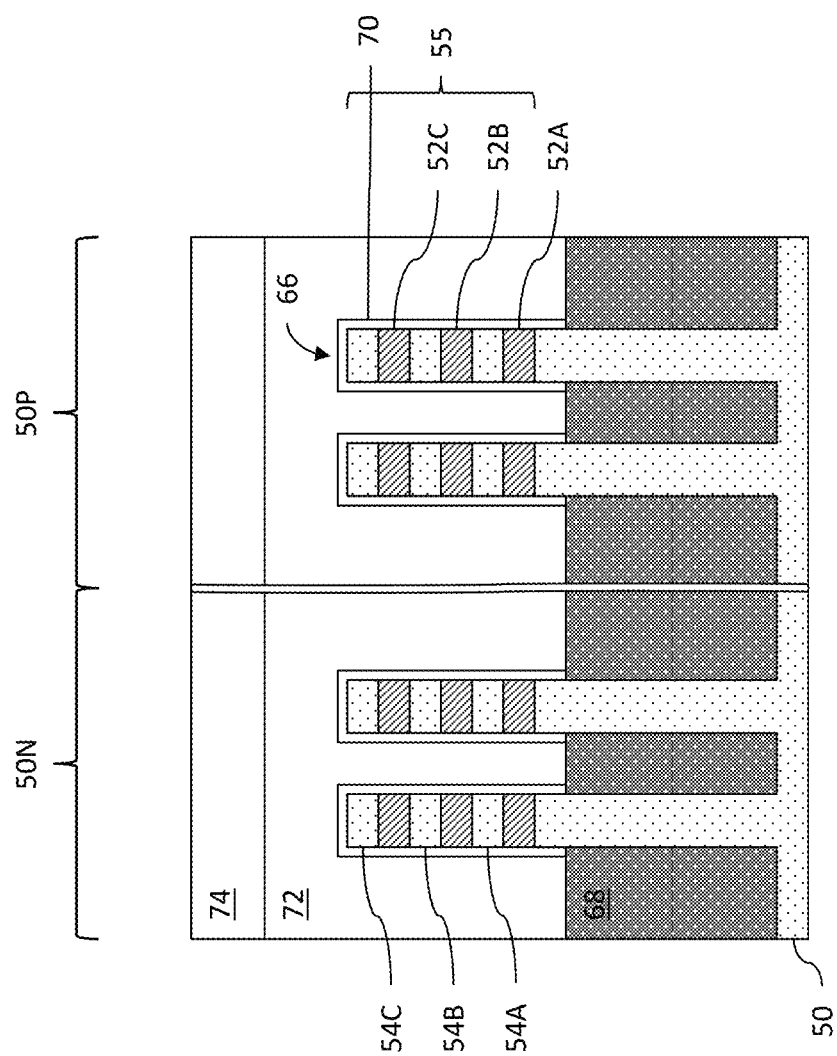

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
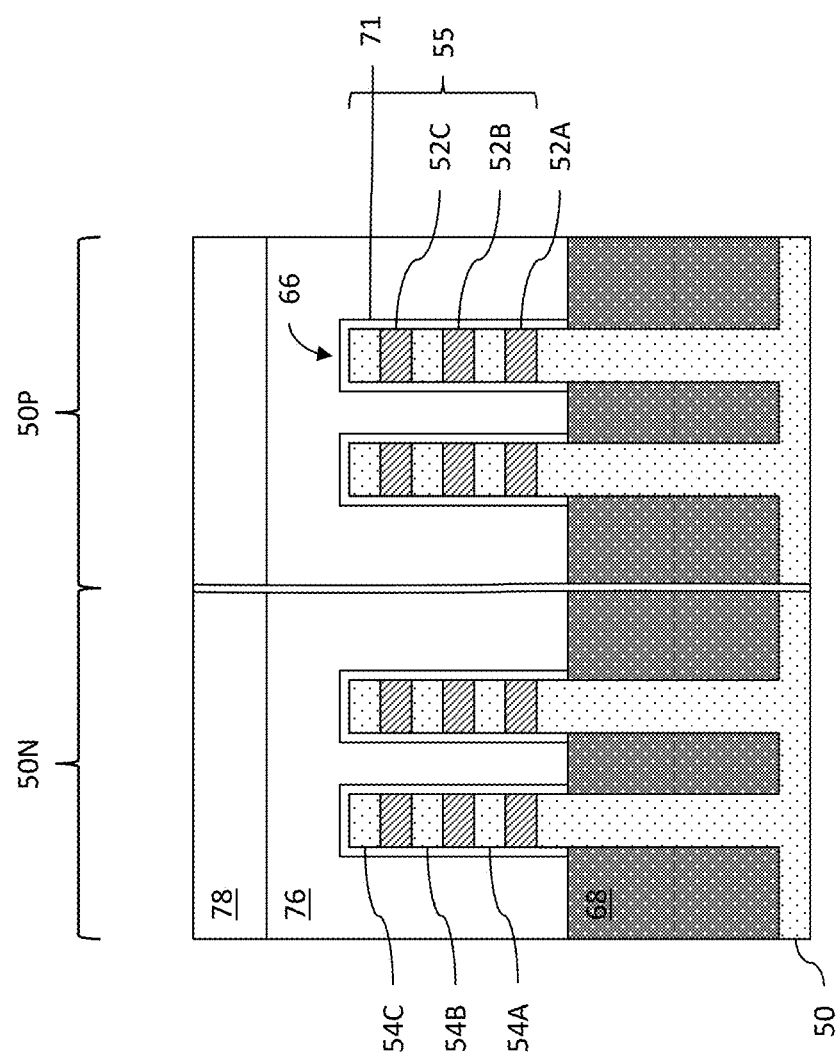
Figure 6B:
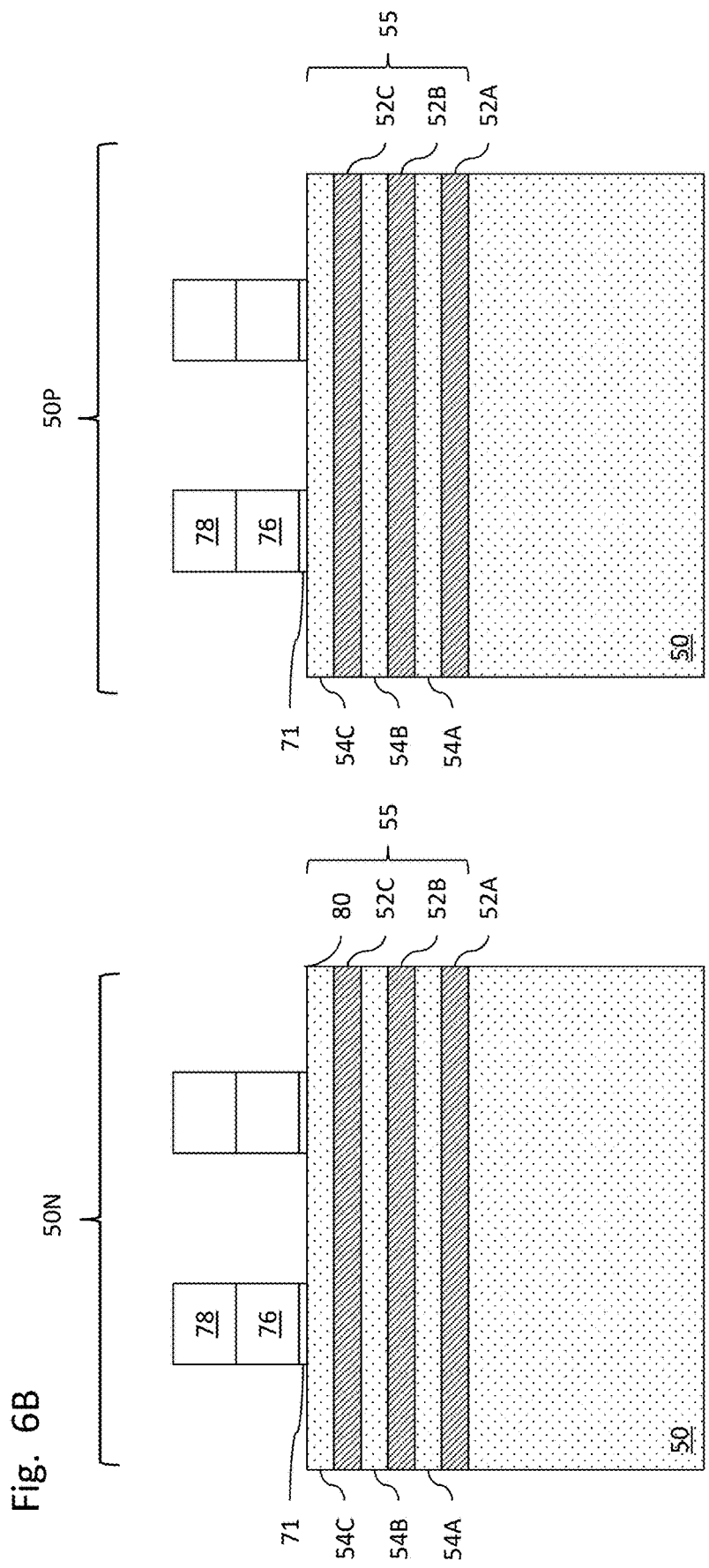

FIGS. 6A through 26C illustrate various additional steps in the manufacturing of embodiment devices. FIGS. 7A, 8A, 14A, 16A, 17A, 18A, 18C, 19A, 19C, 20A, 21A, 24C, 25C, and 26C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figures 7A, 7B:
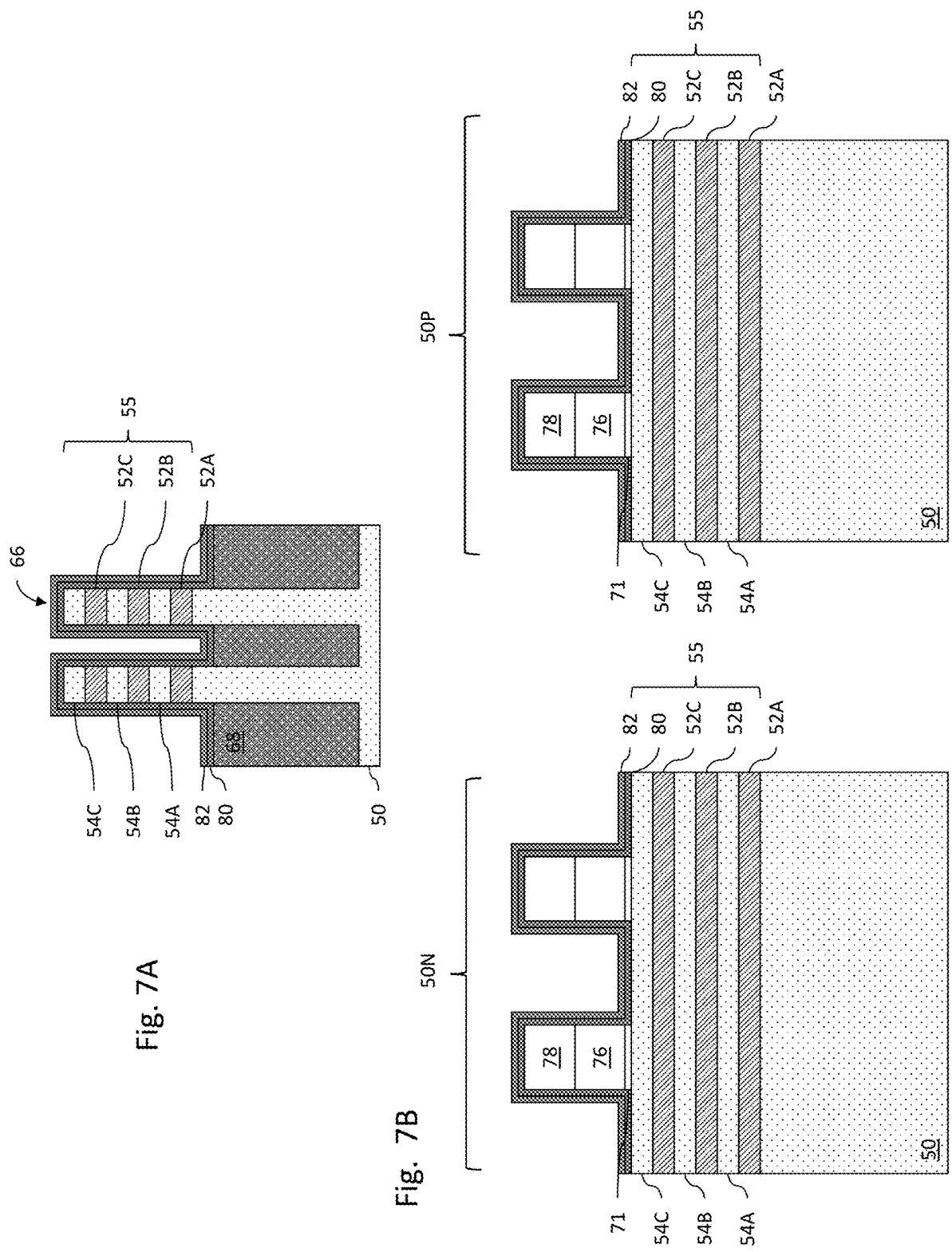

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
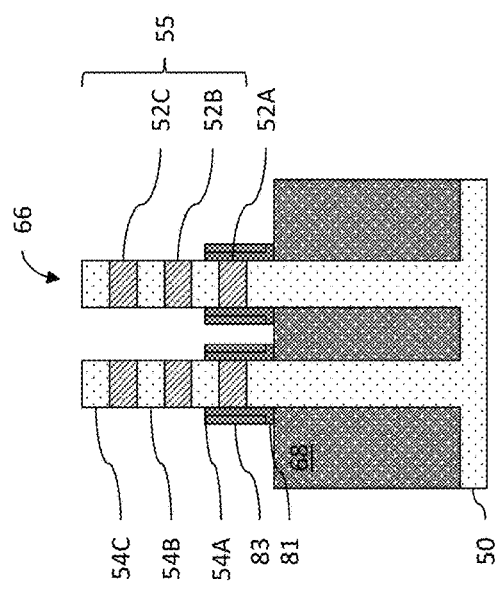
Figure 8B:
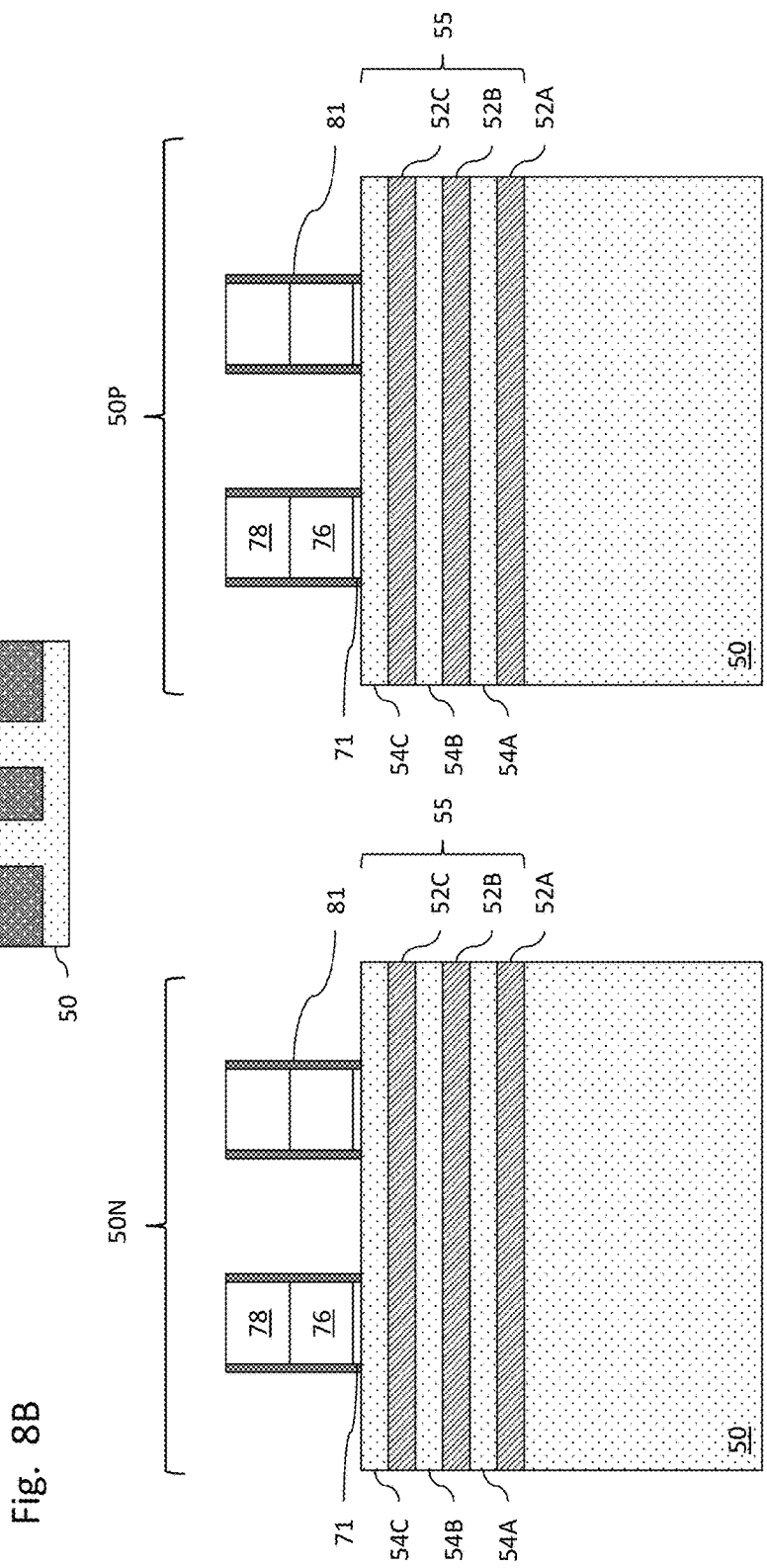

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 70. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

In FIGS. 9A, 9B, 10A, 10B, 11A, 11B, 12A, 12B, 13A, 13B, 14A, and 14B a series of implantation and recessing steps are undertaken to implant ions into what will become channel regions of the nano-FETs, the implantation ions may form channel junctions which reduce the channel resistance and reduce the resistance between the subsequently formed source/drain regions and channel region. In other words, the channel junction serves to reduce the resistance across the interface between the subsequently formed source/drain regions and the channel region.

Figure 14A:
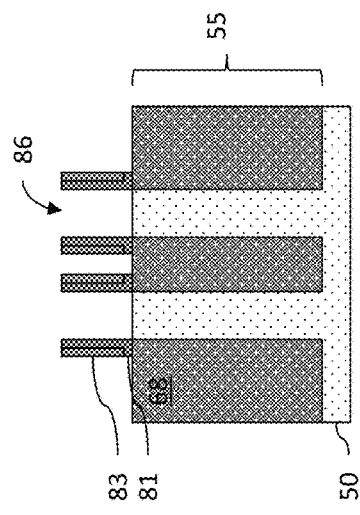
Figure 14B:
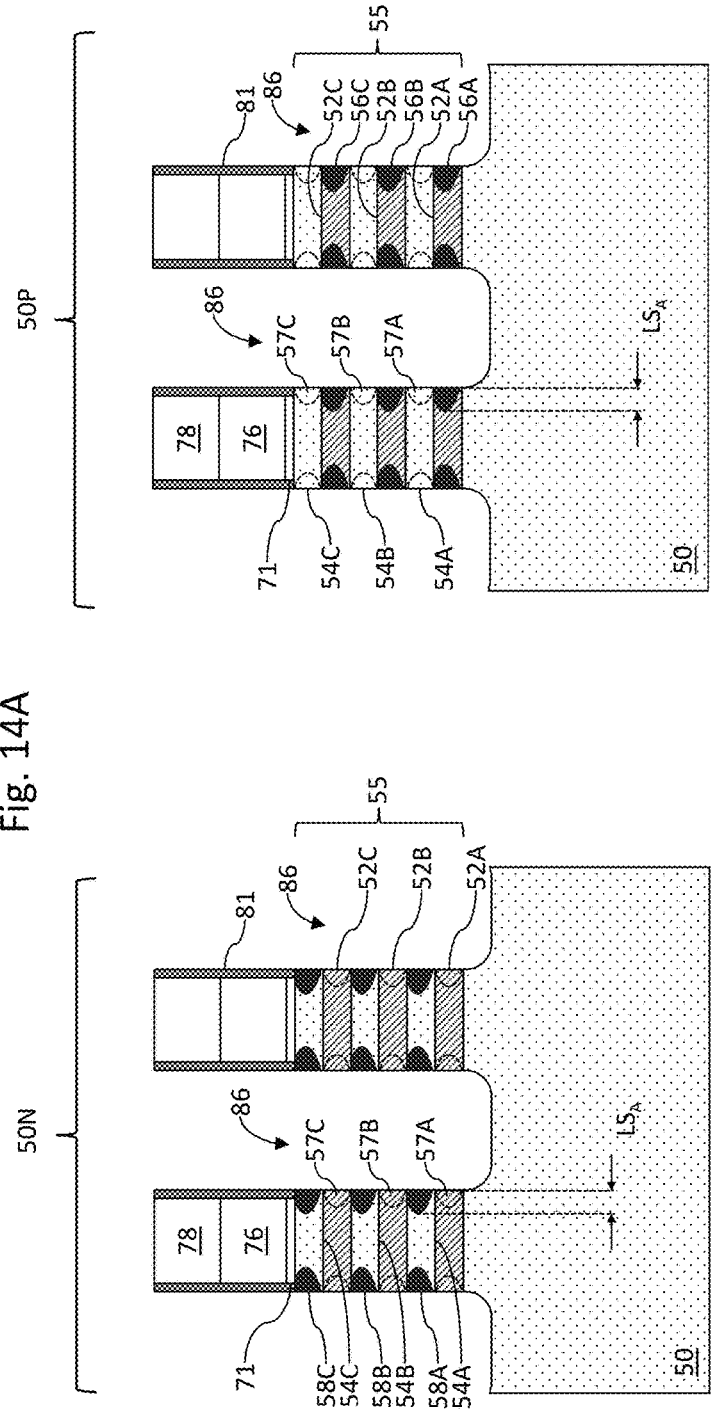

In embodiments with different device types, the devices in the n-type region 50N may be processed separately from the devices in the p-type region 50P. Similar to the implants discussed above in FIG. 4, a mask, such as a photoresist, may be formed over the n-type region 50N, while exposing the p-type region 50P. Then, a series of implantation and recessing steps may be undertaken in the p-type region 50P until first recesses 86 of FIGS. 14A and 14B are formed in the p-type region 50P. The mask may then be removed. Subsequently, a mask, such as a photoresist, may be formed over the p-type region 50P while exposing the n-type region 50N. Then, a series of implantation and recessing steps may be undertaken in the n-type region 50N until first recesses 86 of FIGS. 14A and 14B are formed in the n-type region 50N. The mask may then be removed. In some embodiments, the n-type region 50N may be processed to form recesses 86 of FIGS. 14A and 14B first, followed by the p-type region 50P. Using this process, a single mask may be used to protect the one device region while processing the other device region. Other embodiments may utilize other sequencing to process the n-type region 50N and the p-type region 50P, including for example, using multiple masks to process groups of first nanostructures 52 and/or second nanostructures 54 together.

FIGS. 9A and 9B illustrate an implantation process 59N in the n-type region 50N and an implantation process 59P in the p-type region 50P. The n-type impurities used may be any of the n-type impurities previously discussed, and may include arsenic, phosphorous, and antimony. The p-type impurities used may be any of the p-type impurities previously discussed, and may include boron, $BF_2$, indium, and gallium.

The implantation process 59N and the implantation process 59P may be performed using configurable process conditions, including, for example, implantation energy, implantation angle, implantation temperature, and implantation duration. Generally, each of these process conditions may be adjusted based on the dopant which is used, the target implantation concentration, and the desired implantation depth (vertically and laterally). The implantation process 59N and the implantation process 59P result in implantation regions 57C, a portion of which includes channel junctions 56C in the p-type region 50P and channel junctions 58C in the n-type region 50N. Following implantation, a portion of the first nanostructures 52 and second nanostructures 54 will be removed, leaving behind another portion of the first nanostructures 52 and second nanostructures 54 which will act as the channel region. The implantation process 59N and implantation process 59P is performed to form channel junctions 58C which extend under the first spacers 81 and under the dummy gate electrode 76. Thus, the size of the channel junction 58N is ultimately determined by the lateral straggling of the implanted ions (see, e.g., $LS_c$ of FIG. 10B). Accordingly, one can choose the process conditions to achieve a desired amount of lateral straggling as will be further discussed below.

For each of the implantation process 59N and implantation process 59P, the implantation angle may have a tilt between about 3 degrees to 15 degrees and a rotation angle between 0 and 360 degrees, though other angles are contemplated and may be used. The tilt implantation angle is configurable to provide channel junctions under the first spacers 81. The implantation process 59N and implantation process 59P may be performed at a temperature range between about room temperature (about 20° C.) and about 450° C., though other temperatures are contemplated and may be used. The implantation process 59N and implantation process 59P may be performed for a duration between about 10 sec and 300 sec, though other durations are contemplated and may be used. Implantation energy depends on the dopant used. For the implantation process 59N arsenic may be implanted using an energy between about 3 keV and 15 keV, phosphorous between about 2 keV and 10 keV, and antimony between about 4 keV and 17 keV. For the implantation process 59P, boron may be implanted using an energy between about 1.5 keV and 8 keV, $BF_2$ between about 2.5 keV and 12 keV, indium between about 4 keV and 50 keV and gallium between about 4 keV and 17 keV. It should be understood that other dopants may be used and other implantation energies utilized depending on the dopant used (and other process conditions). Achieved peak implantation concentrations of the channel junctions may be between about $1 \times 10^{18}$ cm$^{-3}$ and $1 \times 10^{22}$ cm$^{-3}$ for arsenic, phosphorous, boron, and $BF_2$ and between about $1 \times 10^{18}$ cm$^{-3}$ and $1 \times 10^{21}$ cm$^{-3}$ for antimony, indium, and gallium.

Following the implantation process 59N, implantation regions 57C include channel junctions 58C formed in the nanostructure 54C which extend under the first spacers 81. In addition, the implantation process 59N may also implant dopants in the nanostructure 52C as part of the implantation regions 57C. When subsequent processes remove the exposed portion of the nanostructure 54C, a corresponding portion of the nanostructure 52C is also removed and a portion of the implantation regions 57C (and implanted dopants) may remain in the nanostructure 52C.

In some embodiments, such as illustrated in FIGS. 9A and 9B, the implantation process 59P is performed on the nanostructures 52C after removing an exposed portion of the nanostructures 54C to reveal the nanostructures 52C. In such embodiments, implantation regions 57C may include areas of the overlying nanostructure 54C under the first spacers 81 and under the dummy gate dielectric 71. In other embodiments, the implantation process 59P is performed using process conditions sufficient to implant ions in both nanostructures 52C and 54C. Such embodiments are illustrated from the illustrated n-type region 50N by substituting the implantation process 59P for the implantation process 59N. The implantation regions 57C would then include the channel junctions 56C and portions of the overlying nanostructures 54C.

Following the implantation process 59P, implantation regions 57C and 57B include channel junctions 56C formed in the nano structure 52C which extend under the first spacers 81. In addition, the implantation process 59P may also implant dopants in the nanostructure 54B, forming implantation regions 57B, and/or nanostructure 54C, forming implantation regions 57C.

FIGS. 10A and 10B illustrate a dry etch process and surface clean process to recess the first nanostructures 52 and the second nanostructures 54 where the epitaxial source/drain regions 92 (see FIGS. 18A and 18B) will be formed. The dry etch may be performed using any suitable etchant to remove the exposed portion of the nanostructures 52C and 54C in the n-type region 50N and the exposed portion of the nanostructures 52C and 54B in the p-type region 50P. When etching the nanostructures 54C in the n-type region 50N, the underlying nanostructures 52C may act as an etch stop or a timed etch may be used. When etching the nanostructures 52C in the n-type region 50N or in the p-type region 50P, the nanostructures 54B may act as an etch stop or a timed etch may be used. Following etching the nanostructures 52C in the p-type device region, in some embodiments, the exposed nanostructures 54B are etched to expose the nanostructures 52B, which can be used as an etch stop or a timed etch may be used. The dry etch process removes damaged areas of the nanostructures 52C and 54C which are damaged by the ion implantation without laterally etching the channel junctions 56C and 58C or the implantation regions 57C which are under the gate spacer 81.

Following each dry etch a surface clean process may be used to remove residue and byproducts resulting from the dry etch. Suitable etchants for the dry etch may include $XeF_2$, $BrF_3$, $C_lF_3$, $CF_4$, $SiF_4$, $NF_3$, the like, or combinations thereof. A corresponding surface cleaning chemical, mixture, or solution may be used such as HF, HNO=, $O_3$, $H_2SO_4$:$H_2O$ (Sulfuric acid-hydrogen Peroxide Mixture (SPM), at a ratio, e.g., 1:4), NH=OH:$H_2O_2$:$H_2O$ (Ammonia hydroxide-hydrogen Peroxide-water Mixture (APM), at a ratio, e.g., 0.25:1:5), and HCl:$H_2O_2$:$H_2O$ (Hydrochloric acid-hydrogen Peroxide-water Mixture (HPM), at a ratio, e.g., 1:1:5), the like, or combinations thereof, respectively.

In some embodiments, the ion implantation, dry etch, and surface clean processes may each be performed in a separate processing chamber. In other embodiments, each processing chamber may be part of a cluster tool. In such embodiments, the cluster tool may be configured to maintain a particular environmental conditions across each of the tool processing chambers. For example, vacuum levels may be maintained between the ion implantation, dry etch, and surface clean processes. The cluster tool may also have processing chambers which provide the processes of applying masking layers, patterning photosensitive materials, and so forth. One or more of these processes may be performed in separate tools.

Following the dry etch and surface cleaning, implantation regions 57C include the implanted areas of the nanostructures 52C and nanostructures 54C under the first spacers 81, including the channel junctions 56C and 58C. The width or lateral straggling $LS_C$ of the channel junctions 56C and 58C extends from the edge of the opening (e.g., a portion of the first recesses 86 of FIGS. 14A and 14B or sidewall of the channel junctions 56C and 58C) to a lateral depth corresponding to a dopant concentration threshold of about $1\times10^{18}$ cm$^{-3}$, after which the dopant concentration drops logarithmically further into the nanostructures 54C and 52C. In some embodiments, the lateral straggling $LS_C$ is between about 3 nm and 5 nm. The channel junctions 56C and 58C may be damaged by the ion implantation, which may be repaired or recrystallized by a subsequent anneal process which may be performed after the surface clean process or at a later stage.

In FIGS. 11A and 11B, second implantation processes 59N and 59P are illustrated. In the n-type region 50N, the second implantation process 59N implants dopants in the nanostructures 54B to form channel junctions 58B, and in the p-type region 50P, the second implantation process 59P implants dopants into the nanostructures 52B to form channel junctions 56B. Implantation regions 57 (e.g., 57A, 57B, and 57C) includes these channel junctions 56B, 58B, as well as the dashed areas, similar to that illustrated in FIGS. 9A and 9B. The second implantation processes 59N and 59P may be performed using processes and materials similar to those discussed above with respect to FIGS. 9A and 9B and are not repeated. The implanted dopants used in the second implantation processes 59N and 59P may be the same or different species than those used in the first implantation processes 59N and 59P of FIGS. 9A and 9B. Further, the process conditions used for the second implantation processes 59N and 59P, such as energy level, tilt, rotation, duration, and temperature, and so forth may be different than those used in the first implantation processes 59N and 59P to achieve desired channel junctions.

FIGS. 12A and 12B illustrate a dry etch process and surface clean process to recess the first nanostructures 52 and the second nanostructures 54 where the epitaxial source/drain regions 92 (see FIGS. 18A and 18B) will be formed, similar to that discussed above with respect to FIGS. 10A and 10B. The dry etch may be performed using any suitable etchant to remove the exposed portion of the nanostructures 52B and 54B in the n-type region 50N and the exposed portion of the nanostructures 52B and 54A in the p-type region 50P. The width or lateral straggling $LS_B$ of the channel junctions 56B and 58B may be between about 3 nm and 5 nm. The channel junctions 56B and 58B may be damaged by the ion implantation, which may be repaired or recrystallized by a subsequent anneal process which may be performed after the surface clean process or at a later stage.

In FIGS. 13A and 13B, third implantation processes 59N and 59P are illustrated. In the n-type region 50N, the second implantation process 59N implants dopants in the nanostructures 54B to form channel junctions 58B, and in the p-type region 50P, the second implantation process 59P implants dopants into the nanostructures 52B to form channel junctions 56B. Implantation regions 57 (e.g., 57A, 57B, and 57C) include these channel junctions 56B, 58B, as well as the dashed areas, similar to that illustrated in FIGS. 9A and 9B. The third implantation processes 59N and 59P may be performed using processes and materials similar to those discussed above with respect to FIGS. 9A and 9B and are not repeated. The implanted dopants used in the third implantation processes 59N and 59P may be the same or different species than those used in the first implantation processes 59N and 59P of FIGS. 9A and 9B and/or those used in the second implantation processes 59N and 59P of FIGS. 11A and 11B. Further, the process conditions used for the third implantation processes 59N and 59P, such as energy level, tilt, rotation, duration, and temperature, and so forth may be different than those used in the first implantation processes 59N and 59P and/or second implantation processes 59N and 59P to achieve desired channel junctions. In embodiments with more nanostructures and additional implantation steps, the dopant species may the same or different than the species used in other nanosheets.

FIGS. 14A and 14B illustrate a dry etch process and surface clean process to recess the first nanostructures 52 and the second nanostructures 54 where the epitaxial source/drain regions 92 (see FIGS. 18A and 18B) will be formed, similar to that discussed above with respect to FIGS. 10A and 10B. The dry etch may be performed using any suitable etchant to remove the exposed portion of the nanostructures 52A and 54A in the n-type region 50N and the exposed portion of the nanostructures 52A in the p-type region 50P. The width or lateral straggling $LS_A$ of the channel junctions 56A and 58A may be between about 3 nm and 5 nm. The dry etch process and surface clean process may be continued to etch a portion of the substrate 50, thereby forming first recesses 86 between the nanostructures 55. The channel junctions 56A and 58A may be damaged by the ion implantation, which may be repaired or recrystallized by a subsequent anneal process which may be performed after the surface clean process or at a later stage.

Figure 15A:
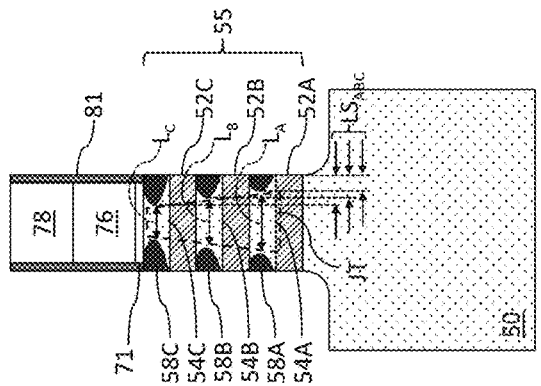
Figure 15B:
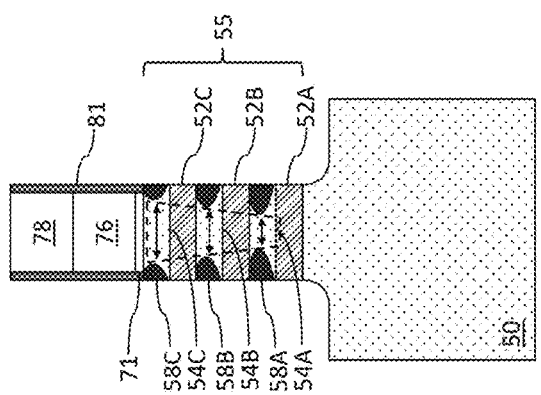
Figure 15C:
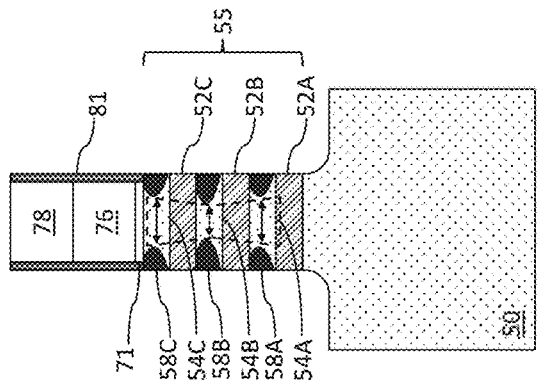
Figure 15D:
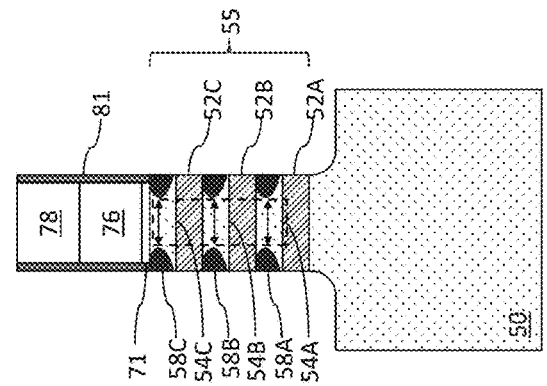
Figure 15E:
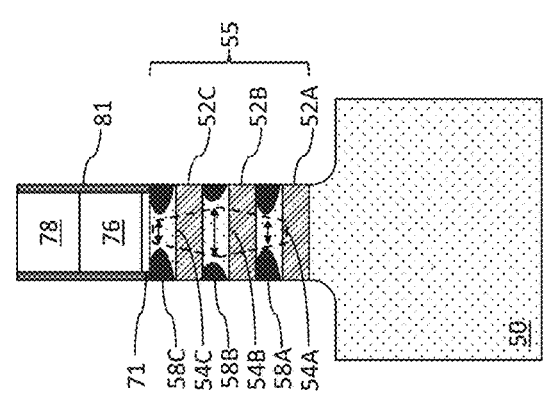
Figure 15F:
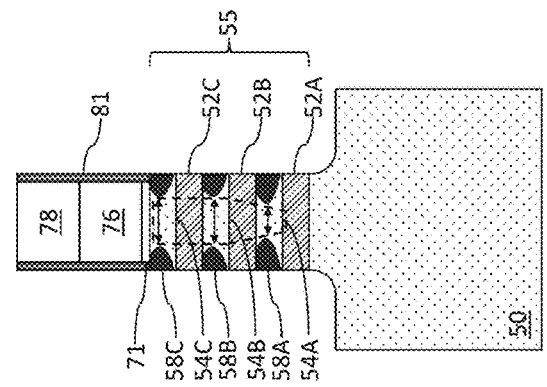
Figure 15M:
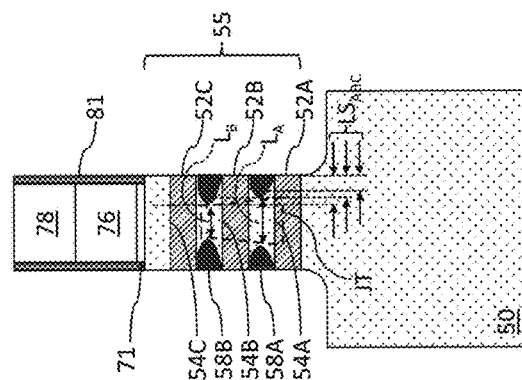
Figure 15N:
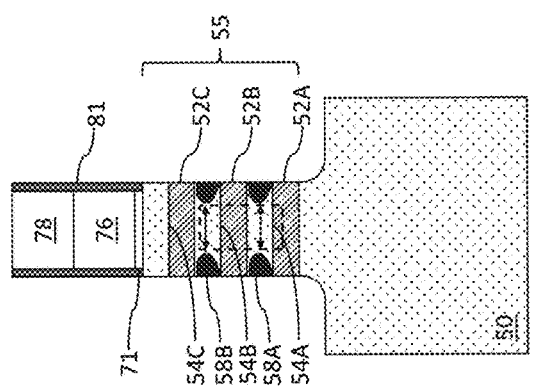
Figure 15O:
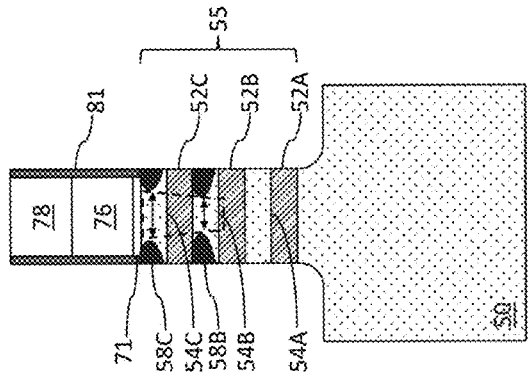
Figure 15P:
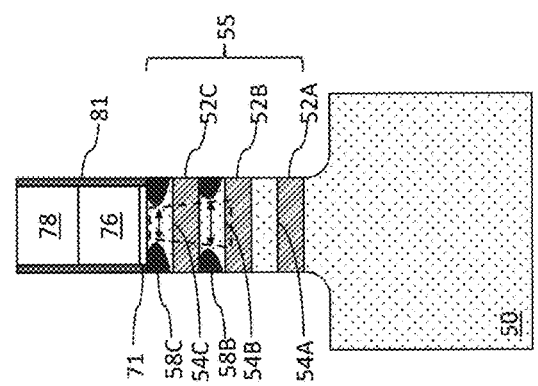
Figure 15Q:
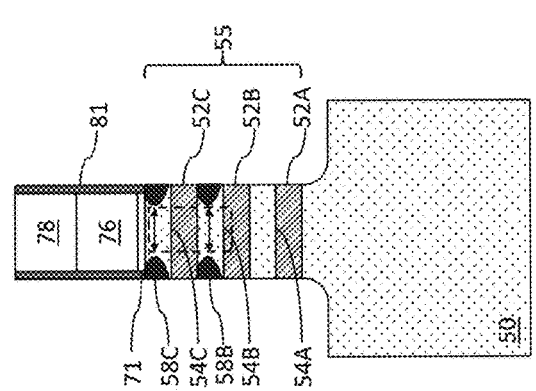
Figure 15R:
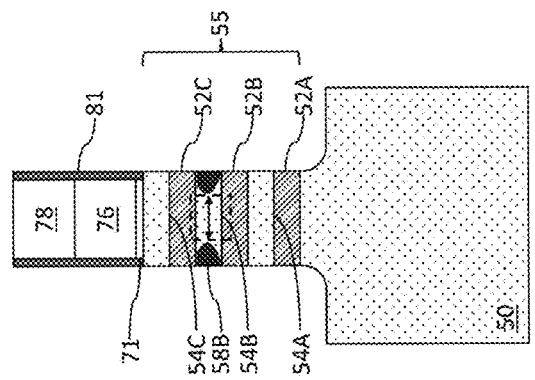
Figure 15U:
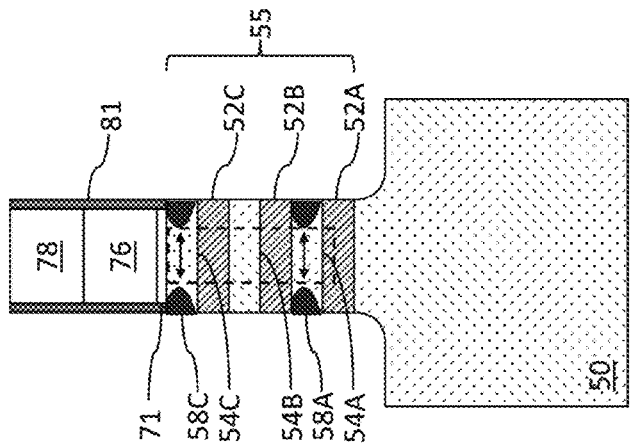

FIGS. 15A through 15U illustrate various embodiments of the resulting channel junctions 56 and 58 of the nanostructures 55. Although these Figures explicitly illustrate the channel junctions 58 for an n-type region 50N, one can readily understand that the same illustrations may be used to understand the same concepts as applied to the p-type region 50P. As noted above, because the process conditions for the ion implantation processes, i.e., implantation processes 59N and 59P, are configurable, the resulting channel junctions 56 and 58 may be configured to have different lateral straggling (LS) for each of the nanostructures 55. When taken together, the different channel junction LS results in different junction types (JT). Each of FIGS. 15A through 15U illustrates a different junction type for a three sheet nanostructure configuration. One of skill will understand that these may be modified for a two sheet nanostructure configuration or a four or more sheet nanostructure configuration. These different junction types may be combined in the same device regions, by utilizing additional masking processes for each junction type. When the description below describes a first distance of implantation as being about the same as a second distance of implantation, in some embodiments, the first distance is within 15% of the second distance. In other embodiments, that the first distance is about the same as the second distance means that the process conditions used for implantation for the first distance are the same as the process conditions used for implantation for the second distance.

Referring to FIG. 15A, the junction type JT has a shape that is trapezoidal with a base which is wider at the bottom than the top. The junction type JT is determined by the undoped channel length L between the two channel junctions 58 at either end. For example, in FIG. 15A the lateral straggling $LS_C$ of the channel junctions 58C is greater than the lateral straggling $LS_B$ of the channel junctions 58B, which is greater than the lateral straggling $LS_A$ of the channel junctions 58A. A corresponding undoped channel length L between each of these channel junctions 58, is inverse to the lateral straggling LS, such that the undoped channel length $L_C$ is less than the undoped channel length $L_B$, which is less than the undoped channel length $L_A$. The resulting shape of the undoped channel lengths L is trapezoidal. A similar junction type JT may be realized for the p-type region 50P and channel junctions 56.

The different junction types demonstrate the ability to provide nanosheet junctions with variable and configurable lateral straggling LS. The controllable junctions may be configured, for example, to provide customized device-by-device control of device characteristics including DC boost, short channel effects, and leakage control.

In FIG. 15B, the junction type JT has an inverted trapezoidal shape. The undoped channel length $L_C$ is greater than the undoped channel length $L_B$ in nanostructure 54B. The undoped channel length $L_B$ in nanostructure 54B is greater than the undoped channel length $L_A$ in the nanostructure 54A. The lateral straggling $LS_C$ of the channel junction 58C is less than the lateral straggling $LS_B$ of the channel junction 58B. The lateral straggling $LS_B$ of the channel junction 58B is less than the lateral straggling $LS_A$ of the channel junction 58A. A similar junction type JT may be realized for the p-type region 50P and channel junctions 56.

In FIG. 15C, the junction type JT has an hour glass shape. The undoped channel length $L_C$ is greater than the undoped channel length $L_B$ in nanostructure 54B. The undoped channel length $L_B$ in nanostructure 54B is less than the undoped channel length $L_A$ in the nanostructure 54A. The undoped channel length $L_C$ and $L_A$ are about the same. The lateral straggling $LS_C$ of the channel junction 58C is less than the lateral straggling $LS_B$ of the channel junction 58B. The lateral straggling $LS_B$ of the channel junction 58B is greater than the lateral straggling $LS_A$ of the channel junction 58A. The lateral straggling $LS_C$ and $LS_A$ are about the same. A similar junction type JT may be realized for the p-type region 50P and channel junctions 56.

In FIG. 15D, the junction type JT has a rectangular shape. The undoped channel length $L_C$, $L_B$, and $L_A$ are about the same. The lateral straggling $LS_C$, $LS_B$, and $LS_A$ are about the same. A similar junction type JT may be realized for the p-type region 50P and channel junctions 56.

In FIG. 15E, the junction type JT has an inverted hour glass shape. The undoped channel length $L_C$ is less than the undoped channel length $L_B$ in nanostructure 54B. The undoped channel length $L_B$ in nanostructure 54B is greater than the undoped channel length $L_A$ in the nanostructure 54A. The undoped channel length $L_C$ and $L_A$ are about the same. The lateral straggling $LS_C$ of the channel junction 58C is greater than the lateral straggling $LS_B$ of the channel junction 58B. The lateral straggling $LS_B$ of the channel junction 58B is less than the lateral straggling $LS_A$ of the channel junction 58A. The lateral straggling $LS_C$ and $LS_A$ are about the same. A similar junction type JT may be realized for the p-type region 50P and channel junctions 56.

In FIG. 15F, the junction type JT has a spike shape. The undoped channel length $L_C$ is about the same as the undoped channel length $L_B$. The undoped channel length $L_A$ is less than the undoped channel length $L_B$ and the undoped channel length $L_C$. The lateral straggling $LS_C$ is about the same as the lateral straggling $LS_B$. The lateral straggling $LS_A$ is greater than the lateral straggling $LS_B$ and $LS_C$. A similar junction type JT may be realized for the p-type region 50P and channel junctions 56.

In FIG. 15G, the junction type JT has an inverted spike shape. The undoped channel length $L_B$ is about the same as the undoped channel length $L_A$. The undoped channel length $L_C$ is less than the undoped channel length $L_B$ and the undoped channel length $L_A$. The lateral straggling $LS_B$ is about the same as the lateral straggling $LS_A$. The lateral straggling $LS_C$ is greater than the lateral straggling $LS_B$ and $LS_A$. A similar junction type JT may be realized for the p-type region 50P and channel junctions 56.

In FIG. 15H, the junction type JT has an inverted funnel shape. The undoped channel length $L_C$ is about the same as the undoped channel length $L_B$. The undoped channel length $L_A$ is greater than the undoped channel length $L_B$ and the undoped channel length $L_C$. The lateral straggling $LS_C$ is about the same as the lateral straggling $LS_B$. The lateral straggling $LS_A$ is less than the lateral straggling $LS_B$ and $LS_C$. A similar junction type JT may be realized for the p-type region 50P and channel junctions 56.

In FIG. 15I, the junction type JT has a funnel shape. The undoped channel length $L_B$ is about the same as the undoped channel length $L_A$. The undoped channel length $L_C$ is greater than the undoped channel length $L_B$ and the undoped channel length $L_A$. The lateral straggling $LS_B$ is about the same as the lateral straggling $LS_A$. The lateral straggling $LS_C$ is less than the lateral straggling $LS_B$ and $LS_A$. A similar junction type JT may be realized for the p-type region 50P and channel junctions 56.

FIGS. 15J through 15U illustrate further configurations where some of the nanostructures omit the ion implantation, e.g., implantation process 59N or 59P. Thus, one or more of the first nanostructures 52 and/or 54 may be absent channel junctions 56 and/or 58. In other words, one or more of the first nanostructures 52 and/or 54 may have channel junctions 56 and/or 58 while one or more of the first nanostructures 52 and/or 54 may not have channel junctions 56 and/or 58. For the purposes of the discussion below, it should be understood that when one of the nanostructures 54 is described as being "undoped," what is meant that it has not been doped using the implantation process 59N and 59P for that particular nanostructure (e.g., nanostructure 54B). Dopants may still be present, but at concentrations less than the concentration in the channel junctions 56 and/or 58 so that they do not function as channel junctions.

In FIG. 15J, the junction type JT has a trapezoidal shape. The undoped channel length $L_C$ is less than the undoped channel length $L_A$. The nanostructure 54B remains undoped. The lateral straggling $LS_C$ is greater than the lateral straggling $LS_A$. A similar junction type JT may be realized for the p-type region 50P and channel junctions 56.

In FIG. 15K, the junction type JT has an inverse trapezoidal shape. The undoped channel length $L_C$ is greater than the undoped channel length $L_A$. The nanostructure 54B remains undoped. The lateral straggling $LS_C$ is less than the lateral straggling $LS_A$. A similar junction type JT may be realized for the p-type region 50P and channel junctions 56.

In FIG. 15L, the junction type JT has an inverse trapezoidal shape. The undoped channel length $L_B$ is greater than the undoped channel length $L_A$. The nanostructure 54C remains undoped. The lateral straggling $LS_B$ is less than the lateral straggling $LS_A$. A similar junction type JT may be realized for the p-type region 50P and channel junctions 56.

In FIG. 15M, the junction type JT has a trapezoidal shape. The undoped channel length $L_B$ is less than the undoped channel length $L_A$. The nanostructure 54C remains undoped. The lateral straggling $LS_B$ is greater than the lateral straggling $LS_A$. A similar junction type JT may be realized for the p-type region 50P and channel junctions 56.

In FIG. 15N, the junction type JT has a rectangular shape. The undoped channel length $L_B$ is about the same as the undoped channel length $L_A$. The nanostructure 54C remains undoped. The lateral straggling $LS_B$ is about the same as the lateral straggling $LS_A$. A similar junction type JT may be realized for the p-type region 50P and channel junctions 56.

In FIG. 15O, the junction type JT has an inverse trapezoidal shape. The undoped channel length $L_C$ is greater than the undoped channel length $L_B$. The nanostructure 54A remains undoped. The lateral straggling $LS_C$ is less than the lateral straggling $LS_B$. A similar junction type JT may be realized for the p-type region 50P and channel junctions 56.

In FIG. 15P, the junction type JT has a trapezoidal shape. The undoped channel length $L_C$ is less than the undoped channel length $L_B$. The nanostructure 54A remains undoped. The lateral straggling $LS_C$ is greater than the lateral straggling $LS_B$. A similar junction type JT may be realized for the p-type region 50P and channel junctions 56.

In FIG. 15Q, the junction type JT has a rectangular shape. The undoped channel length $L_C$ is about the same as the undoped channel length $L_B$. The nanostructure 54A remains undoped. The lateral straggling $LS_C$ is about the same as the lateral straggling $LS_B$. A similar junction type JT may be realized for the p-type region 50P and channel junctions 56.

In FIG. 15R, the junction type JT has a rectangular shape and only one of the nanostructures 55, nanostructure 54B is doped to form channel junctions 58B. The nanostructures 54A and 54C remain undoped. A similar junction type JT may be realized for the p-type region 50P and channel junctions 56.

Figure 15T:
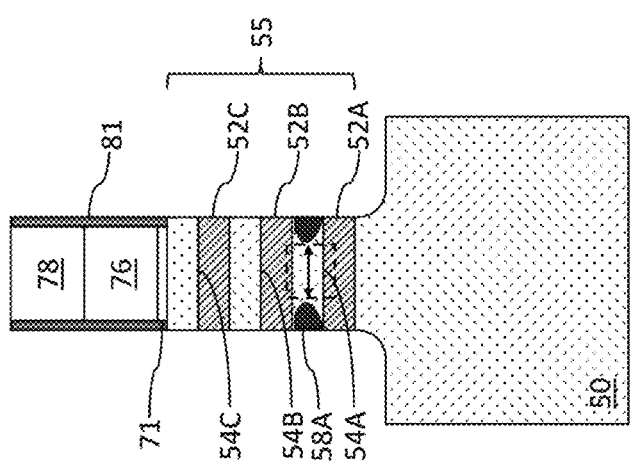
Figure 15S:
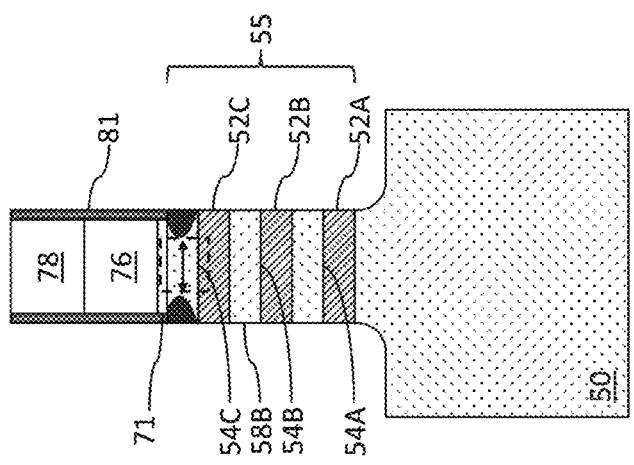

In FIG. 15S, the junction type JT has a rectangular shape and only one of the nanostructures 55, nanostructure 54C is doped to form channel junctions 58C. The nanostructures 54B and 54A remain undoped. A similar junction type JT may be realized for the p-type region 50P and channel junctions 56.

In FIG. 15T, the junction type JT has a rectangular shape and only one of the nanostructures 55, nanostructure 54A is doped to form channel junctions 58A. The nanostructures 54B and 54C remain undoped. A similar junction type JT may be realized for the p-type region 50P and channel junctions 56.

In FIG. 15U, the junction type JT has a rectangular shape. The undoped channel length $L_C$ is about the same as the undoped channel length $L_A$. The nanostructure 54B remains undoped. The lateral straggling $LS_C$ is about the same as the lateral straggling $LS_A$. A similar junction type JT may be realized for the p-type region 50P and channel junctions 56.

In FIGS. 16A and 16B, portions of sidewalls of the layers of the nanostructures 55 formed of the first semiconductor materials (e.g., the first nanostructures 52) exposed by the first recesses 86 are etched to form sidewall recesses 88 in the n-type region 50N, and portions of sidewalls of the layers of the nanostructures 55 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 16B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a dry etch process with hydrogen fluoride, another fluorine-based etchant, or the like may be used to etch sidewalls of the second nanostructures 54 in the p-type region 50P.

In some embodiments, after recessing the sidewalls of the first nanostructures 52 in the n-type region 50N and the second nanostructures 54 in the p-type region 50P, in some embodiments, the sidewalls of the first nanostructures 52 and the second nanostructures 54 may be recessed less than the lateral depth of the implantation regions 57 (see FIGS. 14A and 14B). In such embodiments, the sidewalls of the first nanostructures 52 and the second nanostructures 54 adjacent relative sidewall recesses 88 include a portion of the implantation regions 57. Accordingly, implantation ions (dopants) may be observed at the sidewalls of the recessed first nanostructures 52 and second nanostructures 54. In other embodiments, the implantation regions 57 may be removed from the first nanostructures 52 and the second nanostructures 54 while recessing the sidewalls of the first nanostructures 52 and the second nanostructures 54.

Figure 17A:
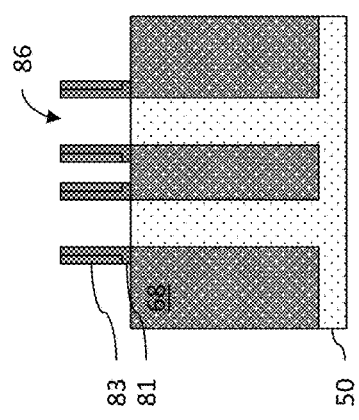
Figure 17B:
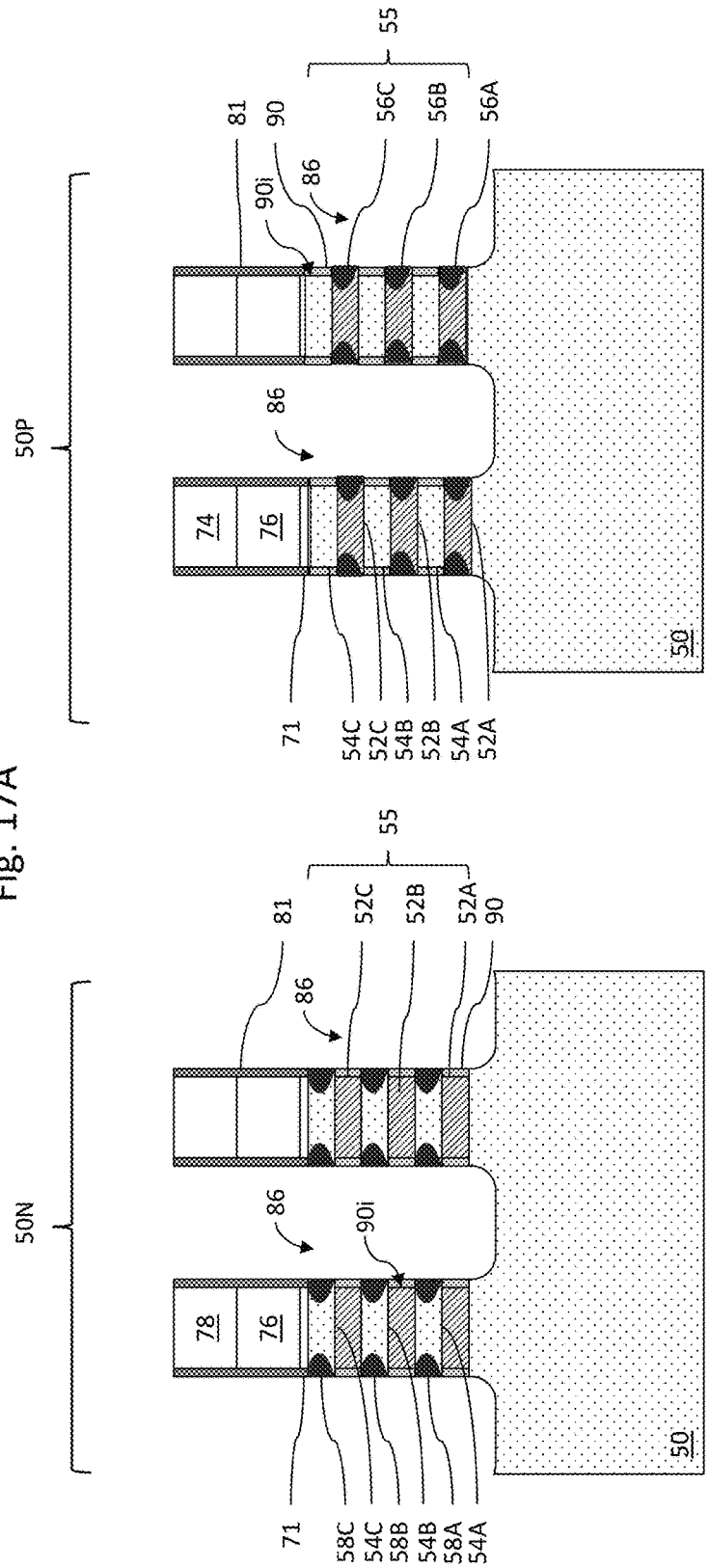
Figure 17C:
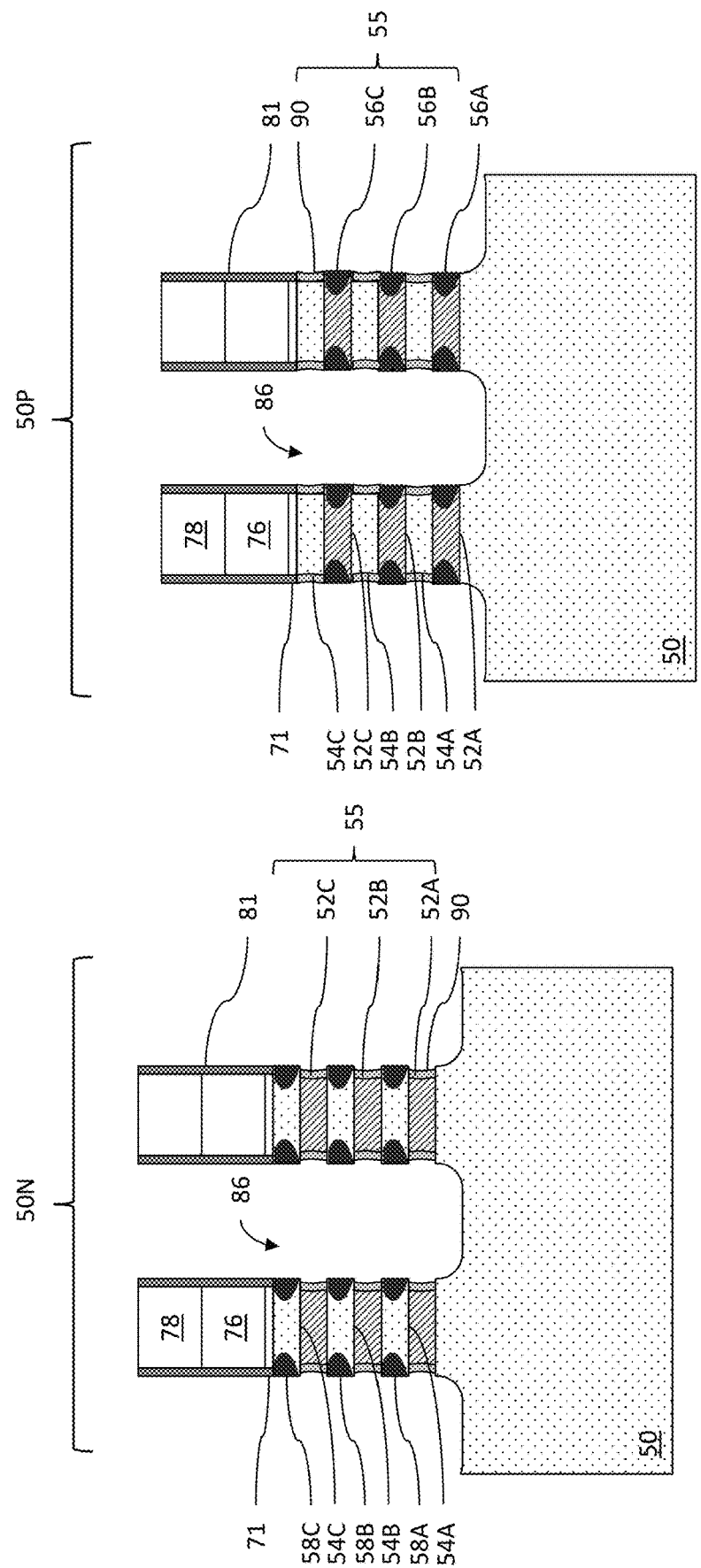

In FIGS. 17A-17C, first inner spacers 90 are formed in the sidewall recess 88. The first inner spacers 90 may be formed by depositing an inner spacer layer (not separately illustrated) over the structures illustrated in FIGS. 16A and 16B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 17B, the outer sidewalls of the first inner spacers 90 may be concave or convex. As an example, FIG. 17C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 18A-18D) by subsequent etching processes, such as etching processes used to form gate structures.

As deposited, the first inner spacers 90 may be free from dopant which may remain in the sidewall recesses 88 of the first nanostructures 52 and the sidewall recesses 88 of the second nanostructures 54, as noted above. However, subsequent processes may cause respective dopants in the implantation regions 57 of the n-type region 50N and the implantation regions 57 of the p-type region 50P to diffuse from the sidewalls of the first nanostructures 52 and/or the second nanostructures 54 into the first inner spacers 90. As such, respective n-type dopants may be found in the first inner spacers 90 in the n-type region 50N and p-type dopants may be found in the first inner spacers 90 in the p-type region 50P. A peak concentration of the respective dopants may be found at an interface 90$i$ between the sidewalls of the first nanostructures 52 or second nanostructures 54 and the first inner spacers 90. The concentration of dopants at the interface 90$i$ may decrease in a gradient in either lateral direction from the interface, i.e., laterally deeper into the first inner spacers 90 from the interface 90$i$ and laterally deeper into the first nanostructures 52 or second nanostructures 54 from the interface 90$i$.

Figure 18A:
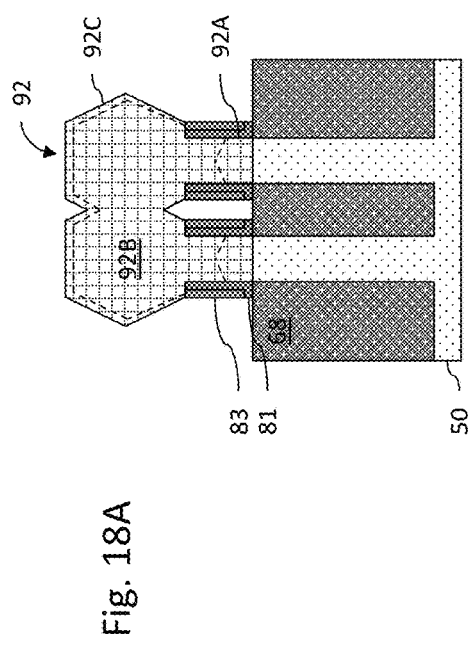
Figure 18B:
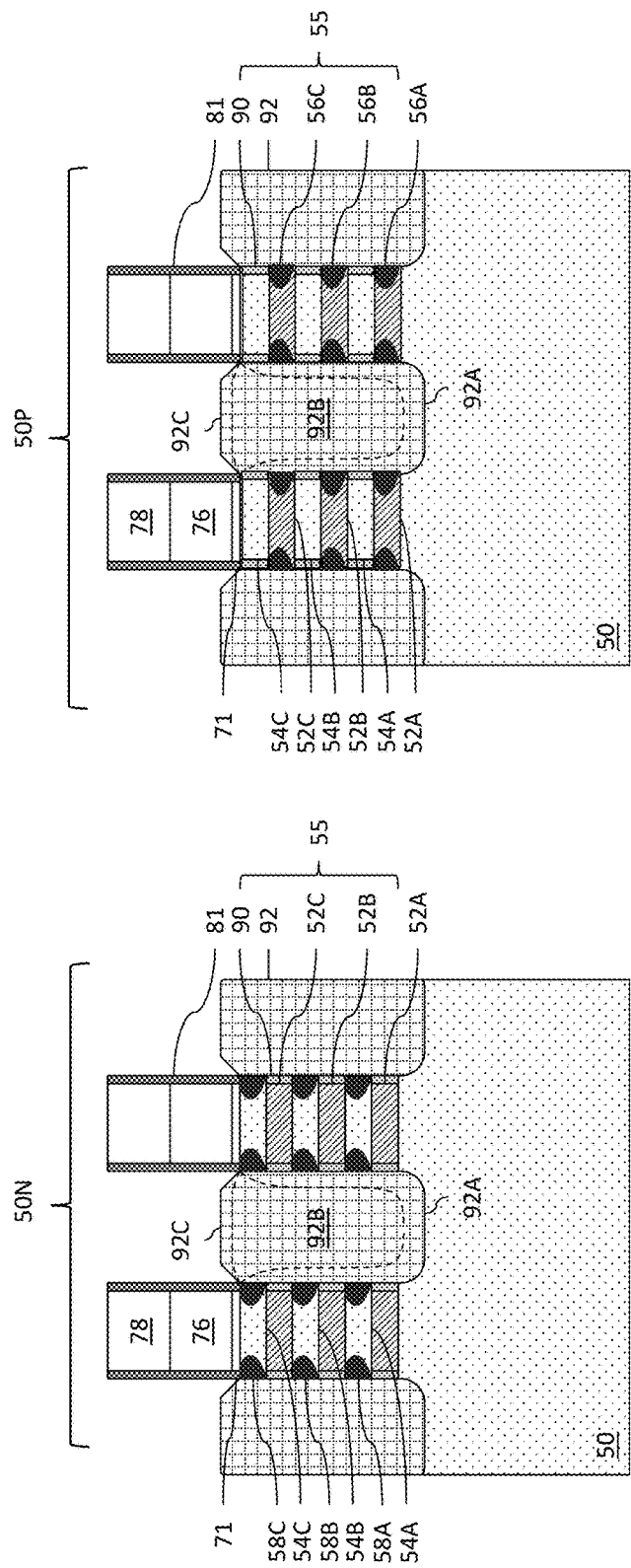

In FIGS. 18A-18D, epitaxial source/drain regions 92 are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated in FIG. 18B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective upper surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 18C:
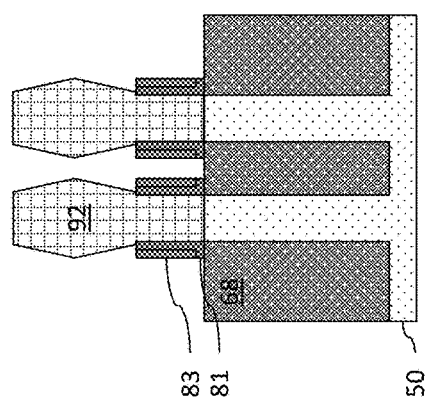

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 18A. In other embodiments, adjacent epitaxial source/drain regions 92 remain separated after the epitaxy process is completed as illustrated by FIG. 18C. In the embodiments illustrated in FIGS. 18A and 18C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 18D:
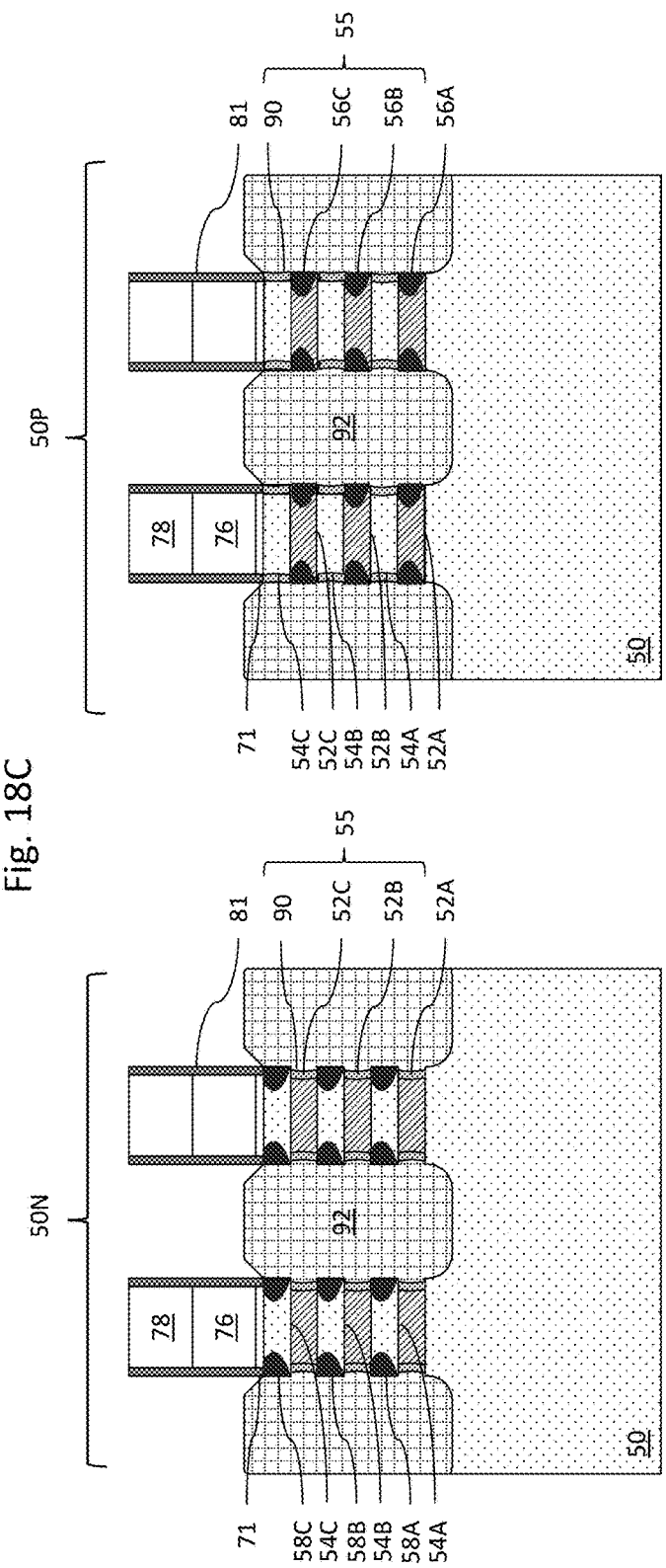

FIG. 18D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 19A:
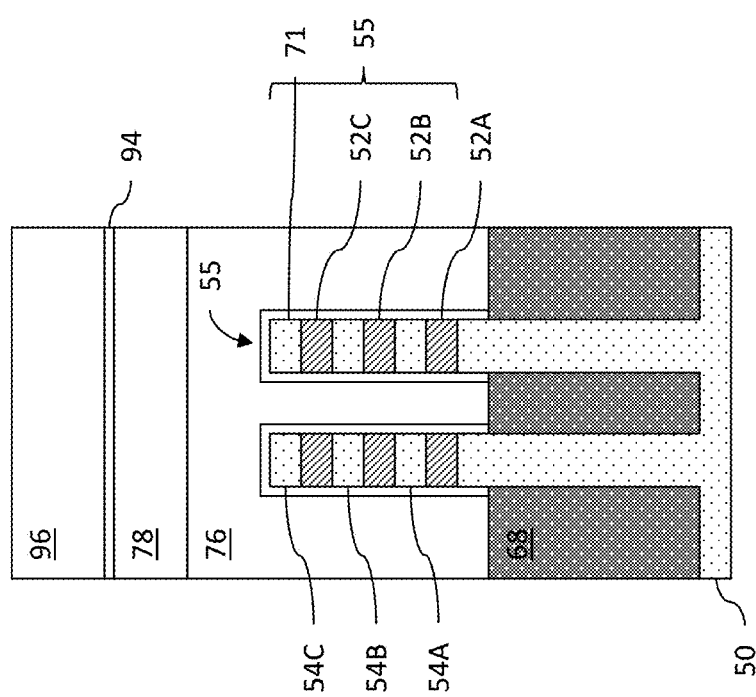
Figure 19B:
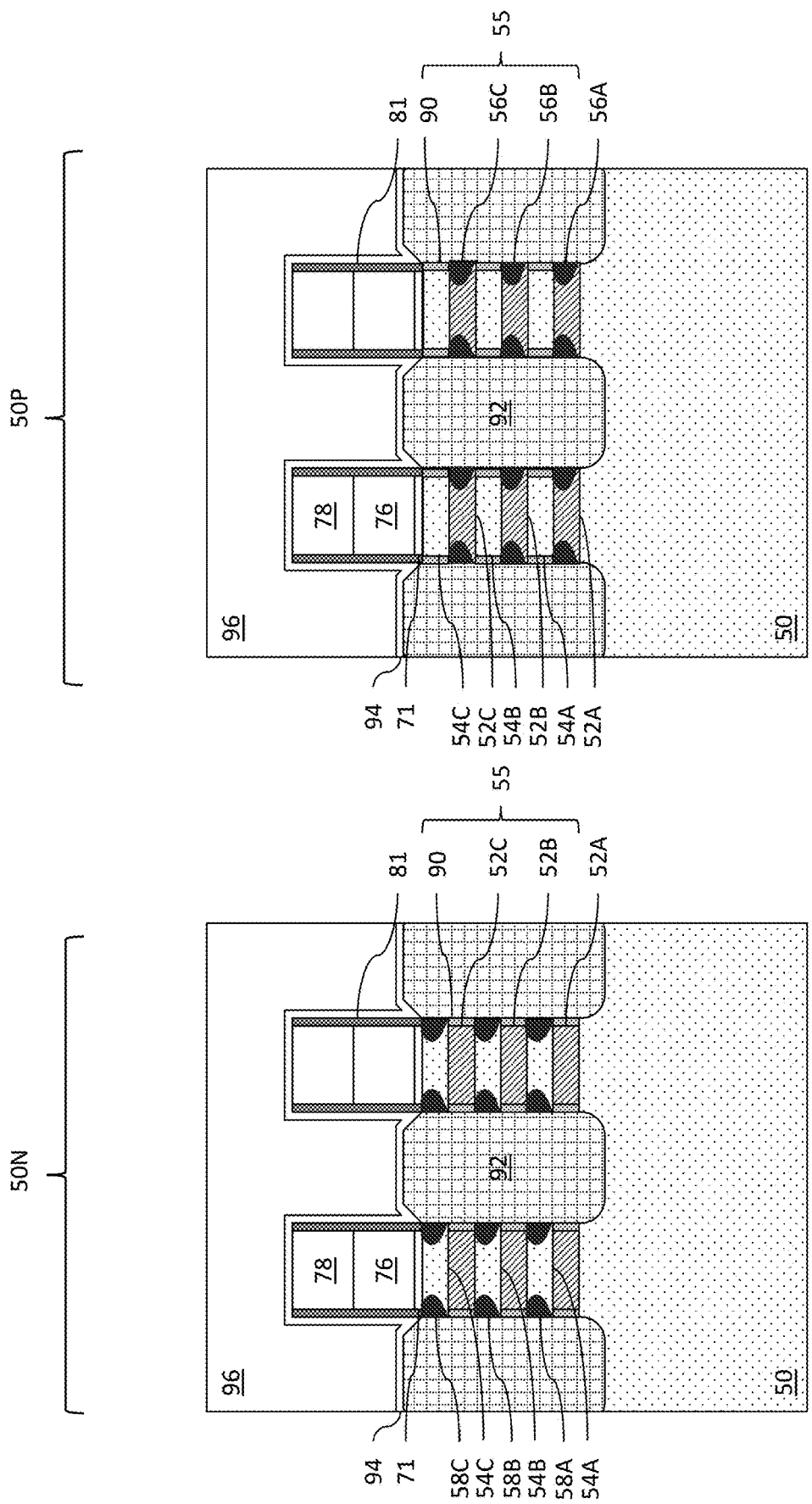
Figure 19C:
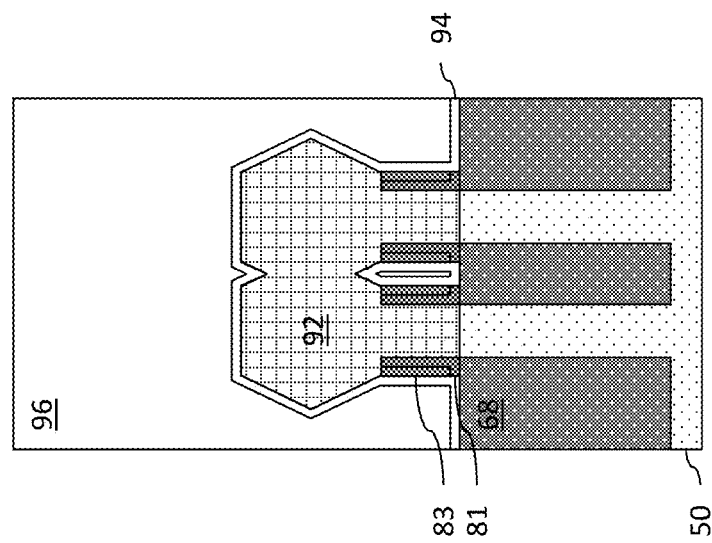

In FIGS. 19A-19C, a first interlayer dielectric (ILD) 96 is deposited over the structure illustrated in FIGS. 6A, 18B, and 18A (the processes of FIGS. 7A-18B do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 20A:
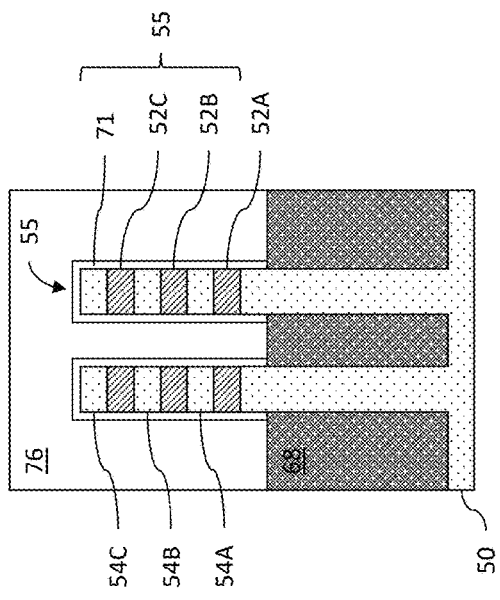
Figure 20B:
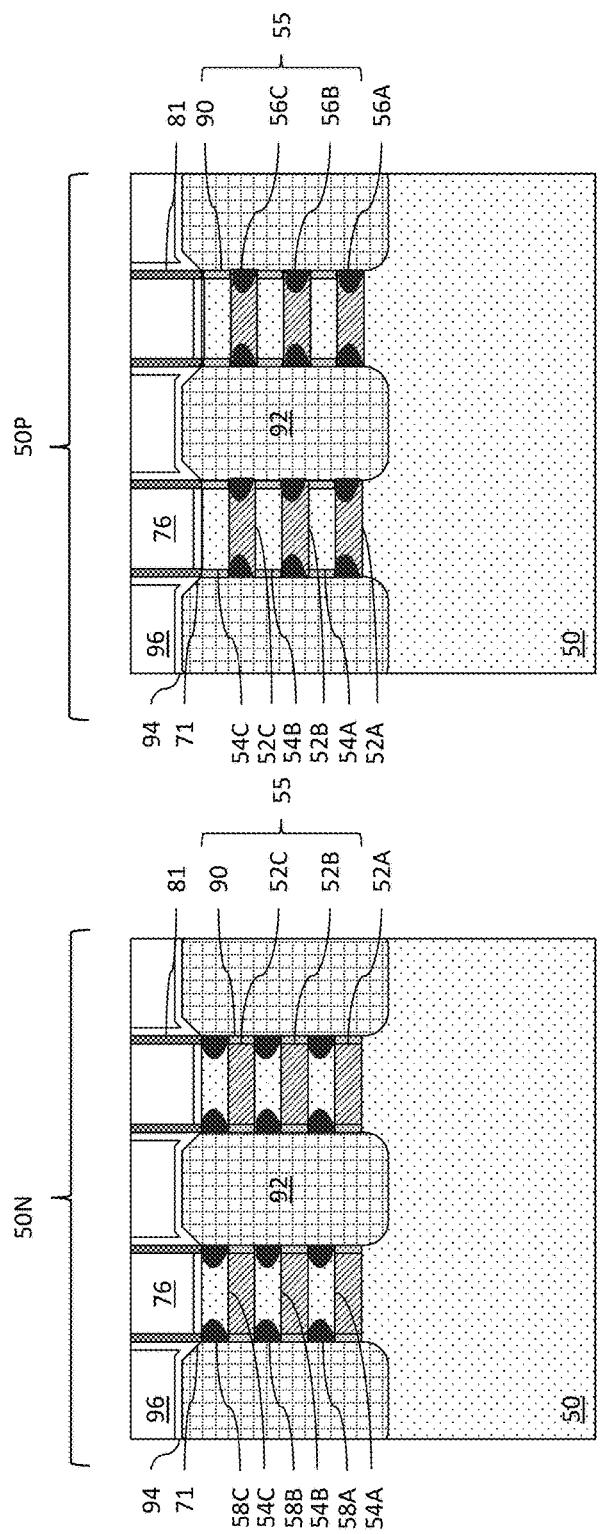

In FIGS. 20A and 20B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 21A:
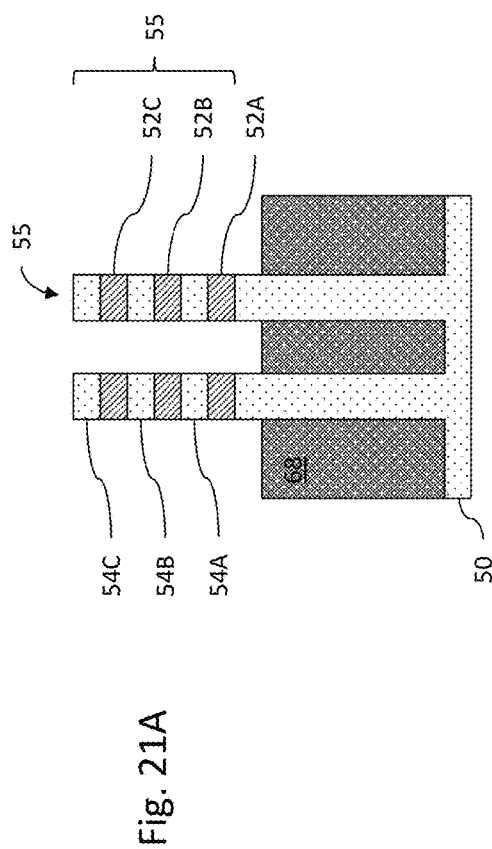
Figure 21B:
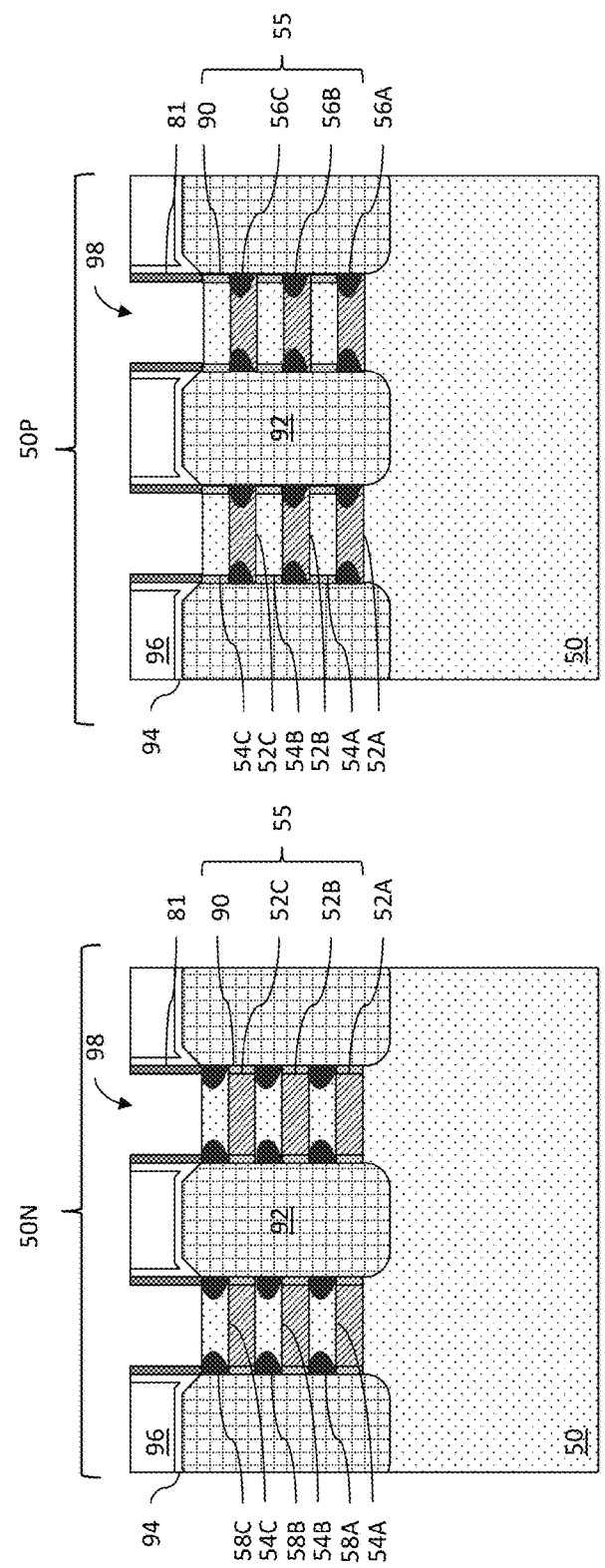

In FIGS. 21A and 21B, the dummy gates 76, and the masks 78 if present, are removed in one or more etching steps, so that second recesses 98 are formed. Portions of the dummy gate dielectric layers 71 in the second recesses 98 are also be removed. In some embodiments, the dummy gates 76 and the dummy gate dielectric layers 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectric layers 71 may be used as etch stop layers when the dummy gates 76 are etched. The dummy gate dielectric layers 71 may then be removed after the removal of the dummy gates 76.

Figure 22B:
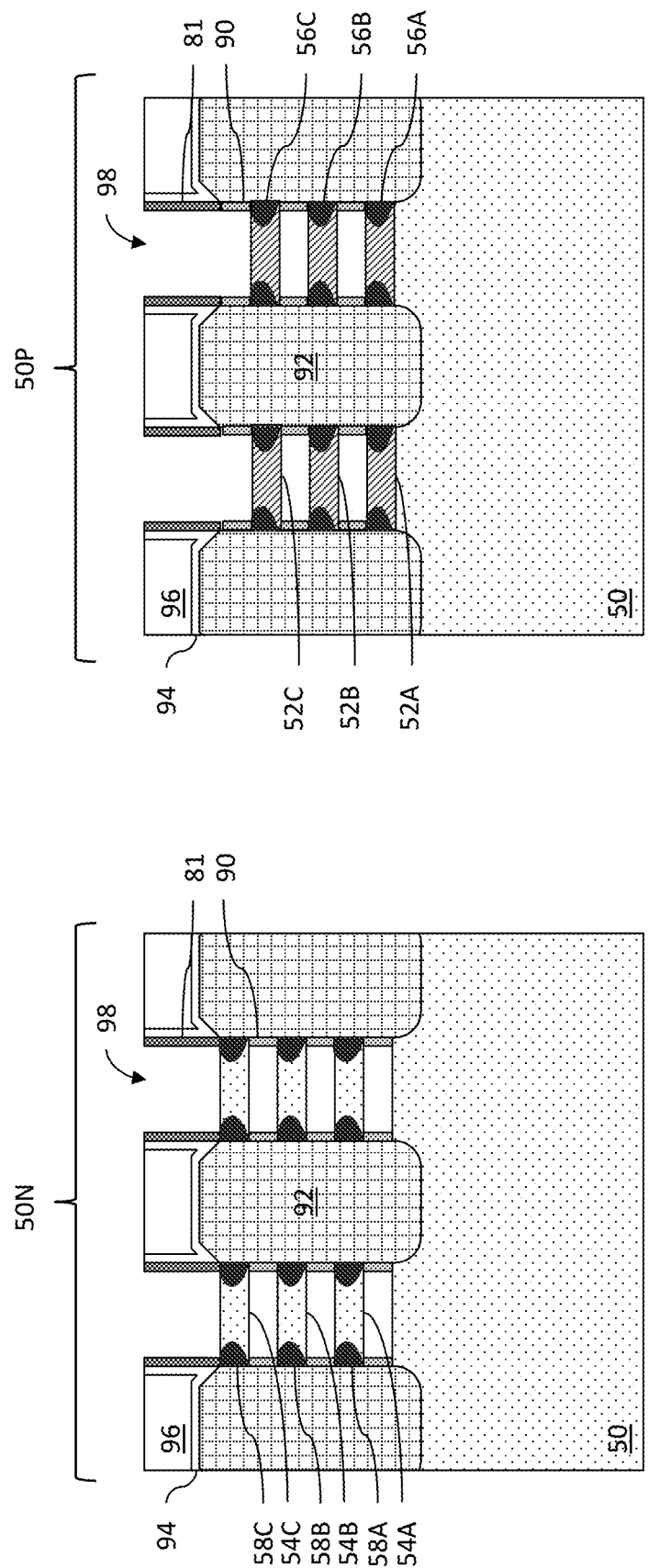

In FIGS. 22A and 22B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

Following removal of the first nanostructures 52 in the n-type region 50N and the second nanostructures 54 in the p-type region 50P, the spacers 90 which span between the remaining second nanostructures 54 and first nanostructures 52, respectively, may be doped. As noted above, the dopants in the nanostructures 55 which were removed may diffuse into the spacer 90. The concentration of the dopant in the spacers 90 is greatest at a side of the spacer opposite the source/drain region 92 and drops in concentration at a gradient toward the source/drain region 92.

Figure 23B:
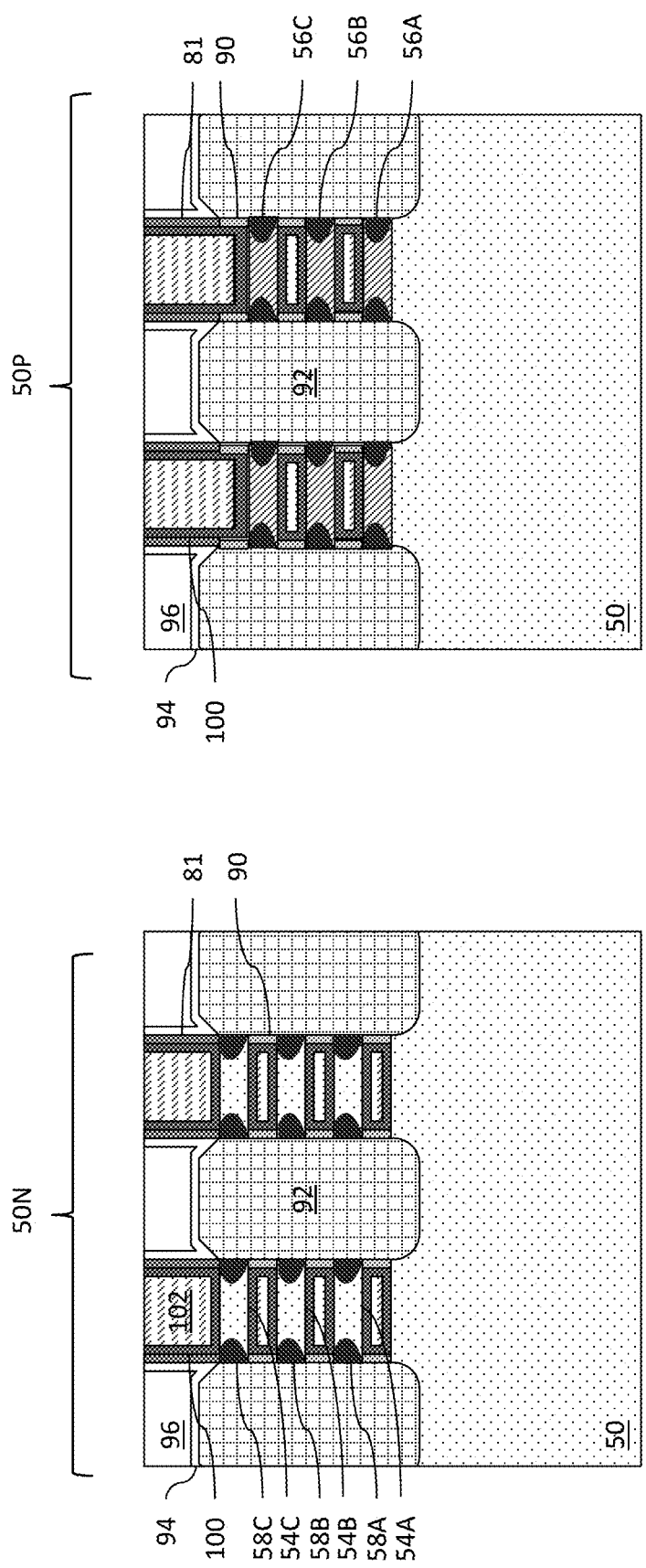

In FIGS. 23A and 23B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 23A and 23B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 24B:
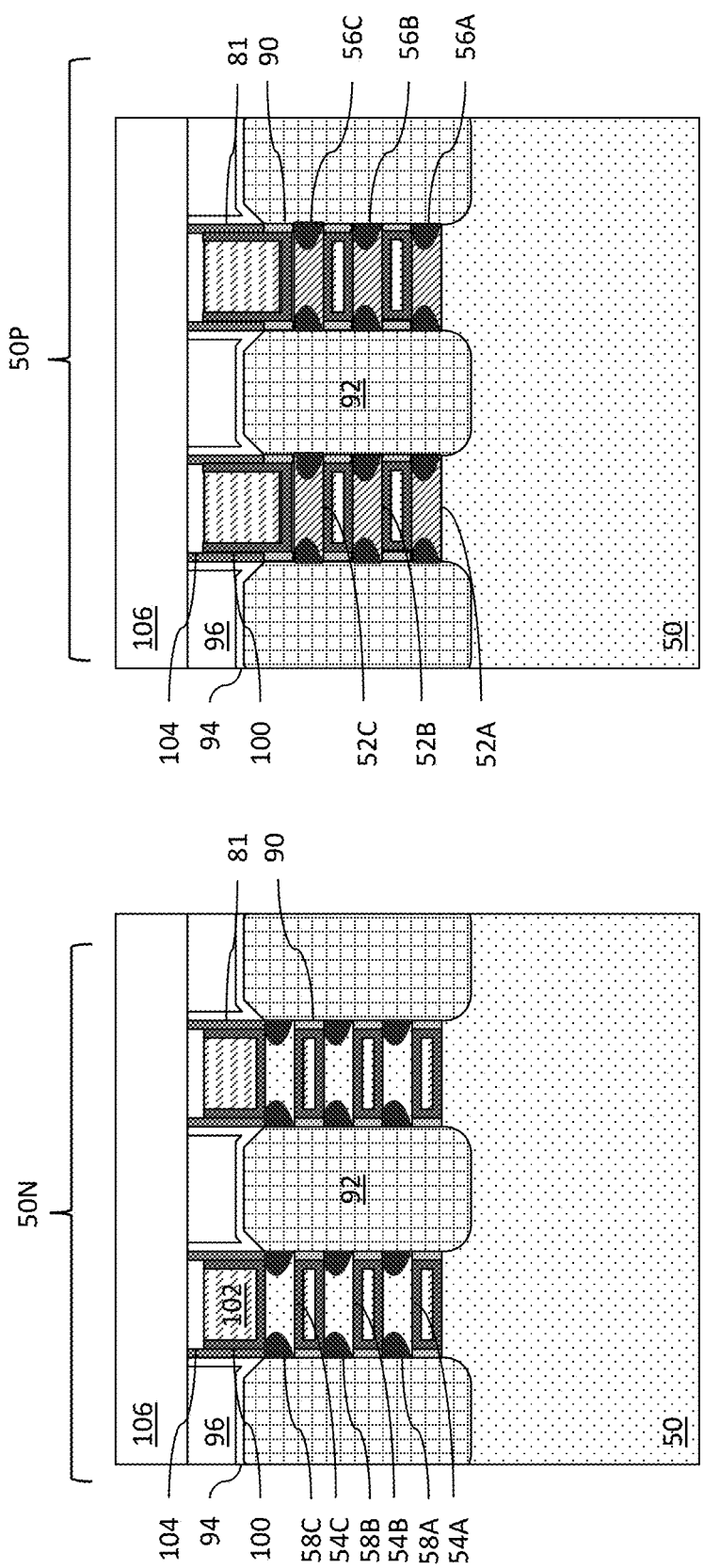
Figure 24C:
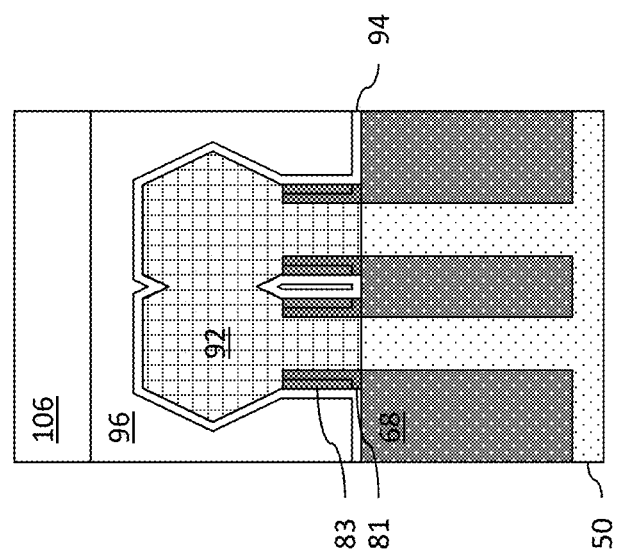

In FIGS. 24A-24C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 26A and 26B) penetrate through the gate mask 104 to contact the top surface of the recessed gate electrodes 102.

As further illustrated by FIGS. 24A-24C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 25A:
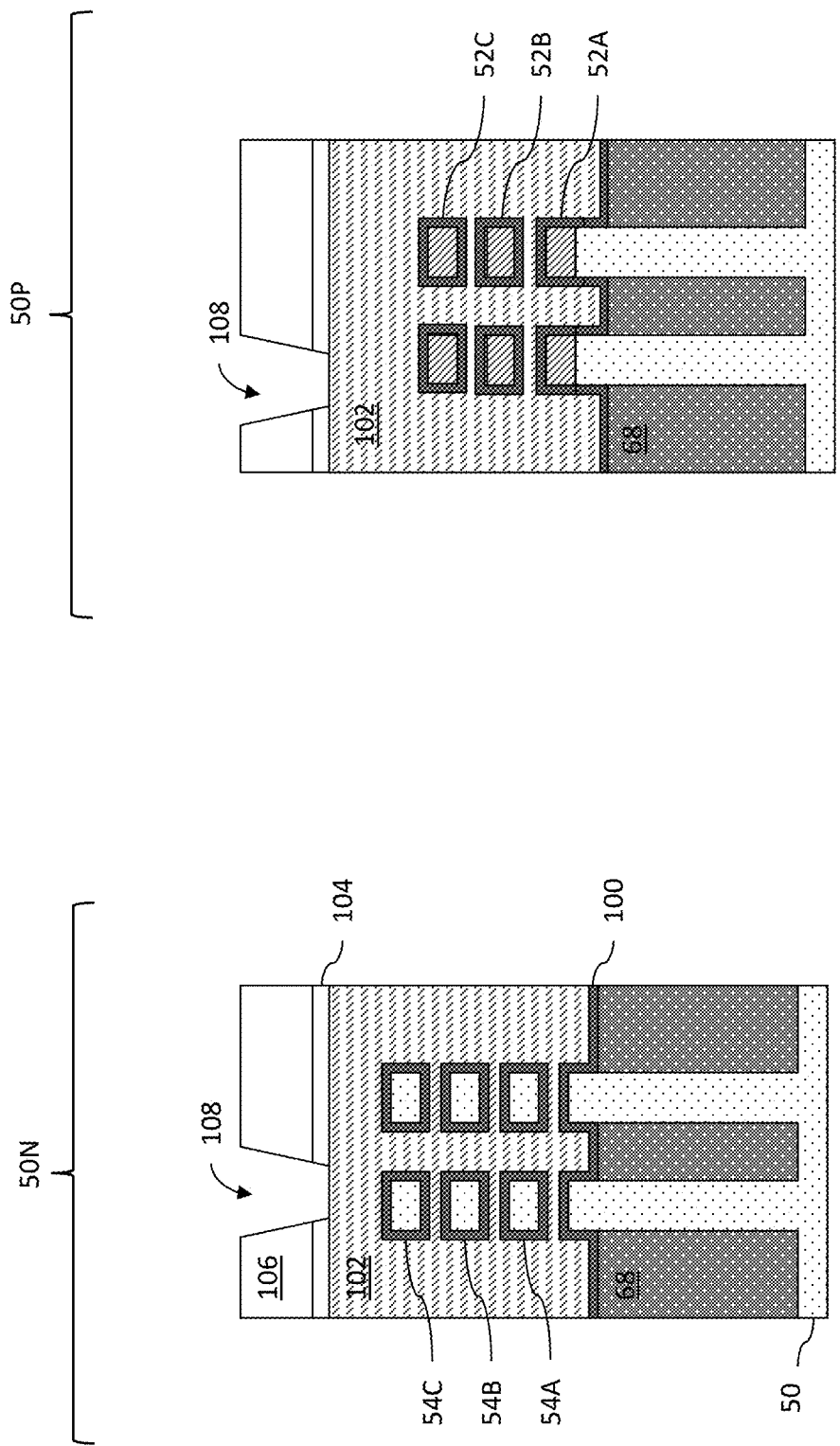
Figure 25B:
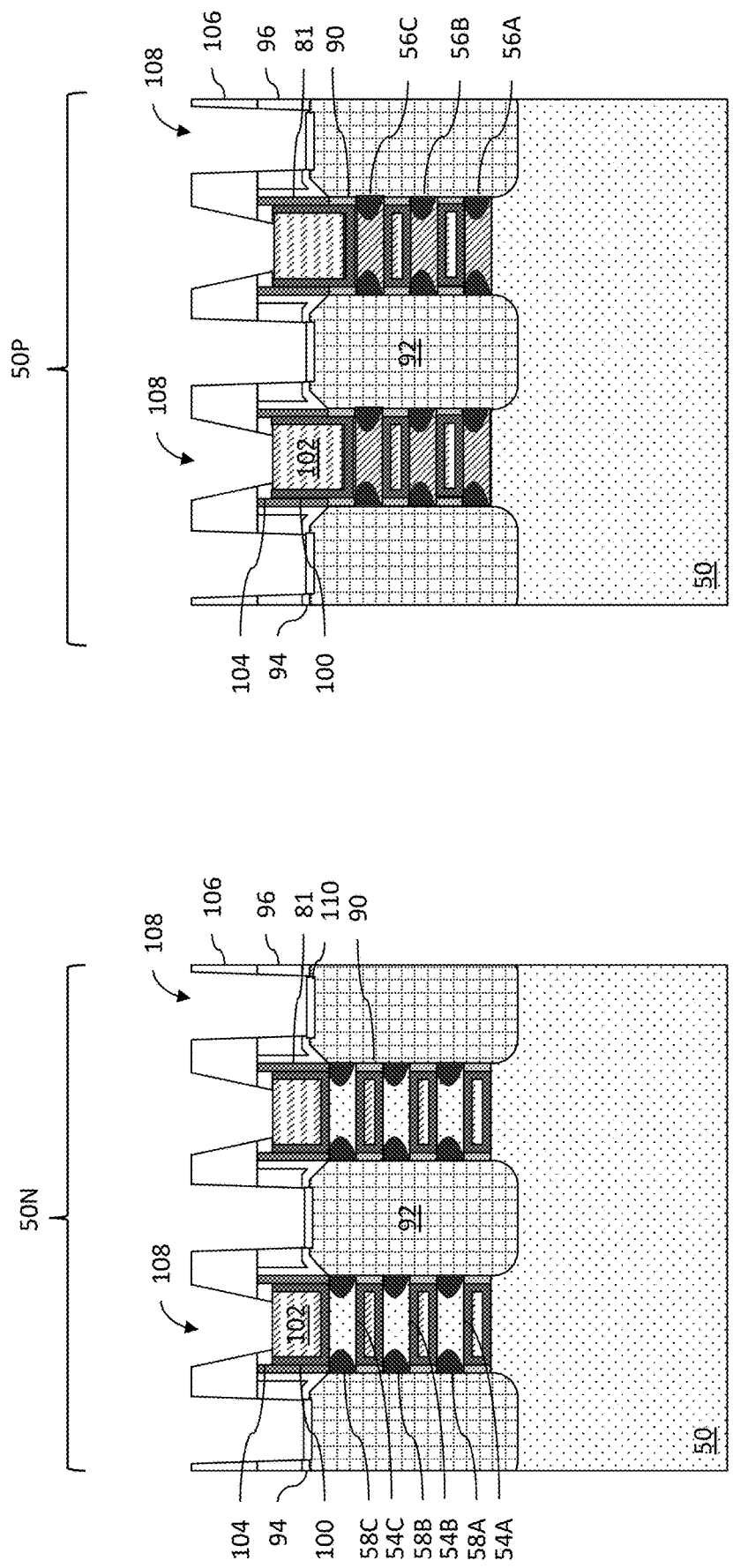
Figure 25C:
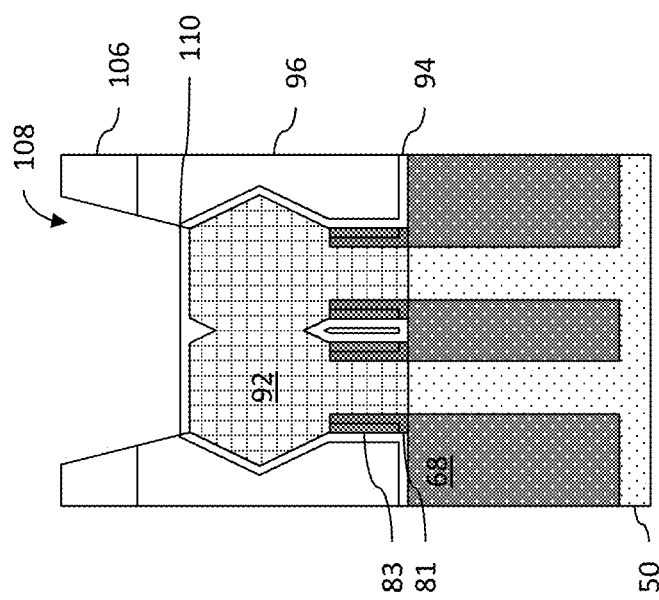

In FIGS. 25A-25C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 25B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 26A:
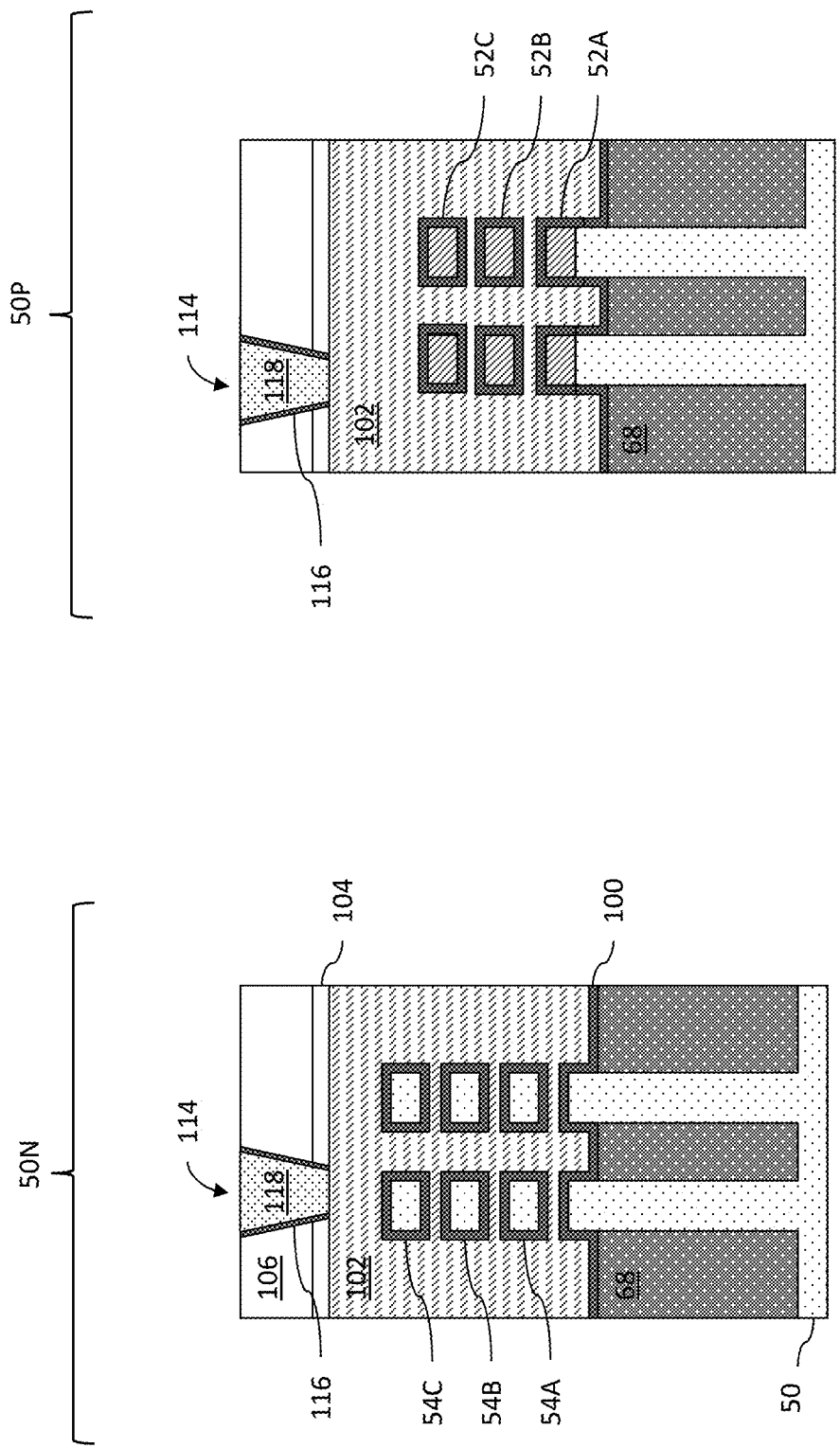
Figure 26B:
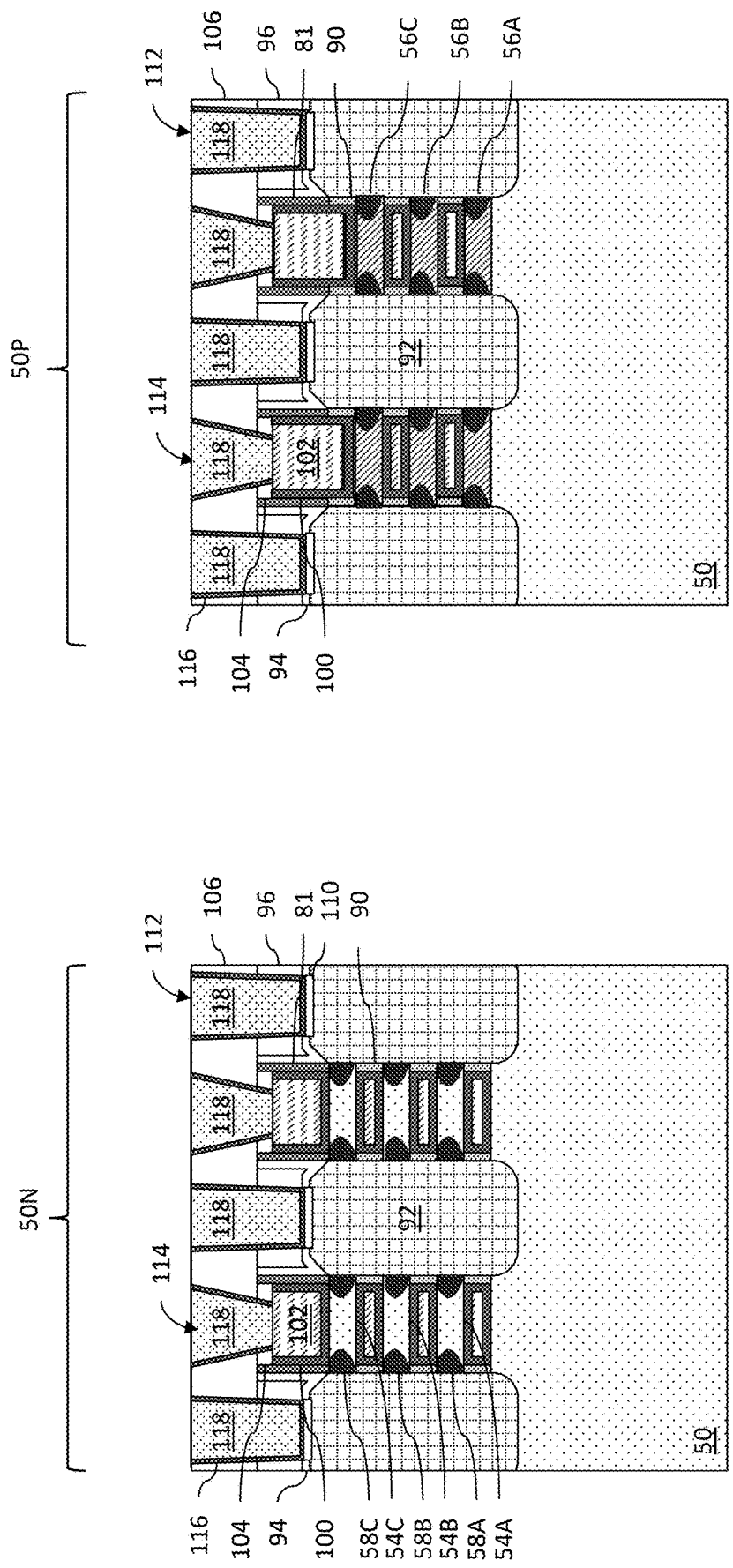
Figure 26C:
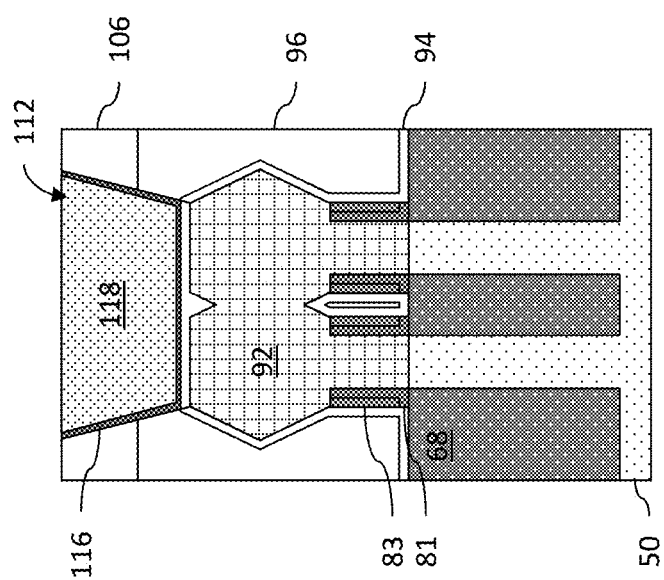

Next, in FIGS. 26A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer 116 and a conductive material 118, and is electrically coupled to the underlying conductive feature (e.g., gate electrodes 102 and/or silicide region 110 in the illustrated embodiment). The gate contacts 114 are electrically coupled to the gate electrodes 102 and may be referred to as gate contacts, and the contacts 112 are electrically coupled to the silicide regions 110 and may be referred to as source/drain contacts. The barrier layer 116 may include titanium, titanium nitride, tantalum, tantalum nitride, or the like. The conductive material 118 may be copper, a copper alloy, silver, gold, tungsten, cobalt, aluminum, nickel, or the like. A planarization process, such as a CMP, may be performed to remove excess material from a surface of the second ILD 106.

Embodiments may achieve advantages. For example, channel junctions may be formed in the nanostructures, thereby reducing overall channel resistance. Further, using a multi-step ion implantation process provides the ability to achieve tunable lateral straggling for each nanostructure implanted. Using a multi-step trench and implantation system provides the ability to dope each nanosheet differently than the others in a channel region under a gate of a nanoFET. Each nanosheet may have an undoped channel width which may be configured for each nanosheet to have a particular lateral straggling, ion concentration, and dopant species. Because each nanosheet can be individually configured, each may have different technical specifications, including omitting implantation from select nanostructures altogether.

One embodiment is a device, the device including a first nanostructure, the first nanostructure including a first doped channel junction at either end. The device also includes a second nanostructure over the first nanostructure, the second nanostructure including a second doped channel junction at either end. The device also includes a gate structure disposed over the first nanostructure and the second nanostructure, the gate structure extending between the first nanostructure and the second nanostructure. The device also includes a source/drain region adjacent the gate structure, the source/drain region contacting the first nanostructure and the second nanostructure. In an embodiment, the device further includes: an inner spacer disposed at either end of the first nanostructure, the inner spacer extending between the first nanostructure and the second nanostructure, the inner spacer interposed between a gate dielectric of the gate structure and the source/drain region. In an embodiment, the inner spacer includes a first dopant, a peak concentration of the first dopant at an interface of the inner spacer and the gate dielectric. In an embodiment, the first doped channel junction has a first lateral straggling between 3 nm and 5 nm. In an embodiment, the second doped channel junction has a second lateral straggling which is different than the first lateral straggling. In an embodiment, a first concentration of dopant in the first doped channel junction is between $1 \times 10^{18}$ cm$^{-3}$ and $1 \times 10^{22}$ cm$^{-3}$.

Another embodiment is a transistor, the transistor including a first nanostructure and a second nanostructure over the first nanostructure, where at least one of the first nanostructure or second nanostructure includes first doped channel junctions at each end and a first undoped channel length between the first doped channel junctions. The transistor also includes a gate structure disposed over the first nanostructure and the second nanostructure, the gate structure extending between the first nanostructure and the second nanostructure. The transistor also includes a source/drain region adjacent the gate structure, the source/drain region contacting the first nanostructure and the second nanostructure. In an embodiment, at least a second one of the first nanostructure or second nanostructure includes second doped channel junctions at each end and a second undoped channel length between the second doped channel junctions. In an embodiment, the first undoped channel length is a different value than the second undoped channel length. In an embodiment, the third nanostructure includes third doped channel junctions at each end and a third undoped channel length between the third doped channel junctions. In an embodiment, at least two of the first undoped channel, the second undoped channel length, and the third undoped channel length are different values. In an embodiment, the first undoped channel, the second undoped channel length, and the third undoped channel length are all different values.

Another embodiment is a method including forming alternating nanostructures over a substrate. The method also includes forming a gate structure over the alternating nanostructures. The method also includes performing a first angled ion implantation to implant first dopants into a first channel end of the first nanostructure, the first channel end under the gate structure. The method also includes etching a first nanostructure of the alternating nanostructures to form a first recess in the first nanostructure adjacent the gate structure, the etching exposing the first channel end of the first nanostructure. The method also includes performing a second angled ion implantation to implant second dopants into a second channel end of the second nanostructure, the second channel end under the gate structure. The method also includes etching a second nanostructure of the alternating nanostructures to extend the first recess and form a second recess in the second nanostructure adjacent the gate structure, the etching exposing the second channel end of the second nanostructure. The method also includes etching to extend the second recess to form a third recess in the substrate. The method also includes and depositing a source/drain region in the third recess. In an embodiment, the method may include: recessing sidewalls of a third nanostructure disposed between the first nanostructure and the second nanostructure; and depositing an inner spacer on the sidewalls of the third nanostructure. In an embodiment, the sidewalls of the third nanostructure may include implanted ions from the first angled ion implantation or the second angled ion implantation, and the method may include annealing the third nanostructure and inner spacer to diffuse implanted ions from the third nanostructure to the inner spacer. In an embodiment, the first angled ion implantation implants first dopants a first lateral distance into the first channel end of the first nanostructure, and where the second angled ion implantation implants second dopants a second lateral distance into the second channel end of the second nanostructure. In an embodiment, the first lateral distance and the second lateral distance have different values. In an embodiment, the first lateral distance and the second lateral distance are each between 3 nm and 5 nm. In an embodiment, the method may include: after etching the first nanostructure to form the first recess, performing a surface clean of the first recess. In an embodiment, the first dopants are a different species than the second dopants.

Another embodiment is a device including a first nanostructure, the first nanostructure including a first doped channel junction at either end, doped by a first dopant. The device also includes a second nanostructure over the first nanostructure, the second nanostructure including a second doped channel junction at either end, doped by a second dopant. The device also includes a gate structure disposed over the first nanostructure and the second nanostructure, the gate structure extending between the first nanostructure and the second nanostructure. The device also includes an epitaxial region adjacent the gate structure, the epitaxial region contacting the first nanostructure and the second nanostructure. The device also includes an inner spacer disposed at either end of the first nanostructure, the inner spacer extending between the first nanostructure and the second nanostructure, the inner spacer interposed between a gate dielectric of the gate structure and the epitaxial region, where an interface between the epitaxial region and the inner spacer is free of the first dopant or the second dopant.

Another embodiment is a device including a first nanostructure, the first nanostructure including first doped channel junctions at each end. The transistor also includes a second nanostructure over the first nanostructure, the second nanostructure including second doped channel junctions at each end, where a first lateral depth of the first doped channel junctions is a different value than a second lateral depth of the second doped channel junctions. The transistor also includes a gate structure disposed over the first nanostructure and the second nanostructure, the gate structure wrapping around the first nanostructure and the second nanostructure. The transistor also includes a first epitaxial region adjacent the gate structure, the first epitaxial region contacting the first nanostructure and the second nanostructure.

Another embodiment is a method including forming multiple nanostructures over a substrate. The method also includes forming a dummy gate structure over the multiple nanostructures. The method also includes performing a first angled ion implantation to implant first dopants under the dummy gate structure into a first nanostructure of the multiple nanostructures. The method also includes etching the first nanostructure to remove a first portion of the first nanostructure exposed from the dummy gate structure, a second portion of the first nanostructure under the dummy gate structure remaining as a first doped channel region performing a second angled ion implantation to implant second dopants under the dummy gate structure into a second nanostructure. The method also includes etching the second nanostructure to remove a first portion of the second nanostructure exposed from the dummy gate structure and the first nanostructure, a second portion of the second nanostructure under the dummy gate structure remaining as a second doped channel region. The method also includes forming a source region or a drain region contacting the first doped channel region and the second doped channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first nanostructure, the first nanostructure comprising a first doped channel junction at either end, doped by a first dopant;
    a second nanostructure over the first nanostructure, the second nanostructure comprising a second doped channel junction at either end, doped by a second dopant, wherein the first dopant and the second dopant comprise different materials;
    a gate structure disposed over the first nanostructure and the second nanostructure, the gate structure extending between the first nanostructure and the second nanostructure;
    an epitaxial region adjacent the gate structure, the epitaxial region contacting the first nanostructure and the second nanostructure; and
    an inner spacer disposed at either end of the first nanostructure, the inner spacer extending between the first nanostructure and the second nanostructure, the inner spacer interposed between a gate dielectric of the gate structure and the epitaxial region, wherein an interface between the epitaxial region and the inner spacer is free of the first dopant or the second dopant.

2. The device of claim 1, wherein the inner spacer comprises the first dopant or the second dopant, wherein a peak concentration of the first dopant or the second dopant at a surface of the inner spacer abutting the gate dielectric.

3. The device of claim 1, wherein the first doped channel junction has a first lateral depth from the epitaxial region, wherein the second doped channel junction has a second lateral depth from the epitaxial region, wherein the first lateral depth is different than the second lateral depth.

4. The device of claim 1, further comprising a third nanostructure, the third nanostructure disposed above the second nanostructure, between the first nanostructure and the second nanostructure, or below the first nanostructure, wherein the third nanostructure lacks a doped channel junction.

5. The device of claim 1, further comprising a third nanostructure, wherein the third nanostructure is free of the first dopant and the second dopant.

6. A transistor comprising:
a first nanostructure, the first nanostructure comprising first doped channel junctions at each end, the first nanostructure having a first undoped channel length between the first doped channel junctions;
a second nanostructure over the first nanostructure, the second nanostructure comprising second doped channel junctions at each end, the second nanostructure having a second undoped channel length between the second doped channel junctions, wherein a first lateral depth of the first doped channel junctions is a different value than a second lateral depth of the second doped channel junctions;
a third nanostructure, the third nanostructure interposed between the first nanostructure and the second nanostructure, the third nanostructure having a third undoped channel length between a first end of the third nanostructure and a second end of the third nanostructure, wherein each of the first nanostructure, second nanostructure, and third nanostructure have the same length, wherein the third undoped channel length is greater than or less than both the first undoped channel length and the second undoped channel length or wherein the third undoped channel length is the same as the first undoped channel length and the second undoped channel length is either greater than or less than the first undoped channel length;
a gate structure disposed over the first nanostructure and the second nanostructure, the gate structure wrapping around the first nanostructure and the second nanostructure; and
a first epitaxial region adjacent the gate structure, the first epitaxial region contacting the first nanostructure and the second nanostructure.

7. The transistor of claim 6, wherein the third undoped channel length extends from the first epitaxial region to a second epitaxial region.

8. The transistor of claim 6, wherein the third nanostructure comprises third doped channel junctions at each end, wherein a third lateral depth of the third doped channel junctions is a greater than or less than both the first lateral depth and the second lateral depth.

9. The transistor of claim 6, wherein the first doped channel junctions or the second doped channel junctions contact the gate structure.

10. The transistor of claim 6, wherein the first doped channel junctions comprise a first dopant; wherein the second doped channel junctions comprise a second dopant, were the first dopant is a different material from the second dopant.

11. The transistor of claim 6, wherein a spacer extends between the first nanostructure and the second nanostructure, the spacer separating the first epitaxial region from the gate structure.

12. The transistor of claim 11, wherein the spacer includes a first dopant at a sidewall interface with the gate structure.

13. A method comprising:
forming multiple nanostructures over a substrate;
forming a dummy gate structure over the multiple nanostructures;
performing a first angled ion implantation to implant first dopants under the dummy gate structure into a first nanostructure of the multiple nanostructures;
etching the first nanostructure to remove a first portion of the first nanostructure exposed from the dummy gate structure, a second portion of the first nanostructure under the dummy gate structure remaining as a first doped channel region;
performing a second angled ion implantation to implant second dopants under the dummy gate structure into a second nanostructure;
etching the second nanostructure to remove a first portion of the second nanostructure exposed from the dummy gate structure and the first nanostructure, a second portion of the second nanostructure under the dummy gate structure remaining as a second doped channel region; and
forming a source region or a drain region contacting the first doped channel region and the second doped channel region.

14. The method of claim 13, further comprising:
performing a sidewall etch of a third nanostructure of the multiple nanostructures, the third nanostructure interposed between the first nanostructure and the second nanostructure; and
forming an inner spacer on sidewalls of the third nanostructure, the inner spacer having an upper interface with the first nanostructure and a lower interface with the second nanostructure.

15. The method of claim 14, further comprising diffusing first dopants from the third nanostructure to the inner spacer.

16. The method of claim 14, wherein the inner spacer has a side interface with the source region or the drain region.

17. The method of claim 13, wherein a first lateral distance of the first doped channel region and a second lateral distance of the second doped channel region are different.

18. The method of claim 17, wherein the first lateral distance and the second lateral distance are each between 3 nm and 5 nm.

19. The method of claim 13, wherein the first dopants are a different species than the second dopants.

20. The method of claim 13, wherein the first doped channel region comprises a doped channel junction on each end and an undoped channel length interposed between the doped channel junctions.

* * * * *